(12) United States Patent
Kolpekwar et al.

(10) Patent No.: US 8,255,191 B1
(45) Date of Patent: Aug. 28, 2012

(54) USING REAL VALUE MODELS IN SIMULATION OF ANALOG AND MIXED-SIGNAL SYSTEMS

(75) Inventors: Abhijeet Kolpekwar, Round Rock, TX (US); Chandrashekar L. Chetput, San Jose, CA (US); Timothy Martin O'Leary, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 525 days.

(21) Appl. No.: 12/433,731

(22) Filed: Apr. 30, 2009

(51) Int. Cl.
*G06F 17/50* (2006.01)

(52) U.S. Cl. .................. 703/2; 703/17; 716/2; 700/189; 324/651

(58) Field of Classification Search ................ 703/2, 15; 700/189; 324/651; 716/2
See application file for complete search history.

(56) References Cited

U.S. PATENT DOCUMENTS

| | | | |
|---|---|---|---|
| 4,772,844 A * | 9/1988 | Andeen et al. ................ 324/651 |
| 5,481,695 A * | 1/1996 | Purks .............................. 703/15 |
| 2009/0281874 A1* | 11/2009 | Leblanc et al. ................ 705/10 |
| 2011/0004446 A1* | 1/2011 | Dorn et al. .................... 702/188 |

* cited by examiner

*Primary Examiner* — Thai Phan
(74) *Attorney, Agent, or Firm* — Schwegman, Lundberg & Woessner, P.A.

(57) ABSTRACT

A method is provided to coerce a wire type net in an integrated circuit design to become a wreal net in the design, comprising: running a wreal coercion process on a computer system including the acts of, identifying a wire type net that is connected to a wreal net in an integrated circuit design; and converting the identified wire type net to a wreal net.

28 Claims, 14 Drawing Sheets

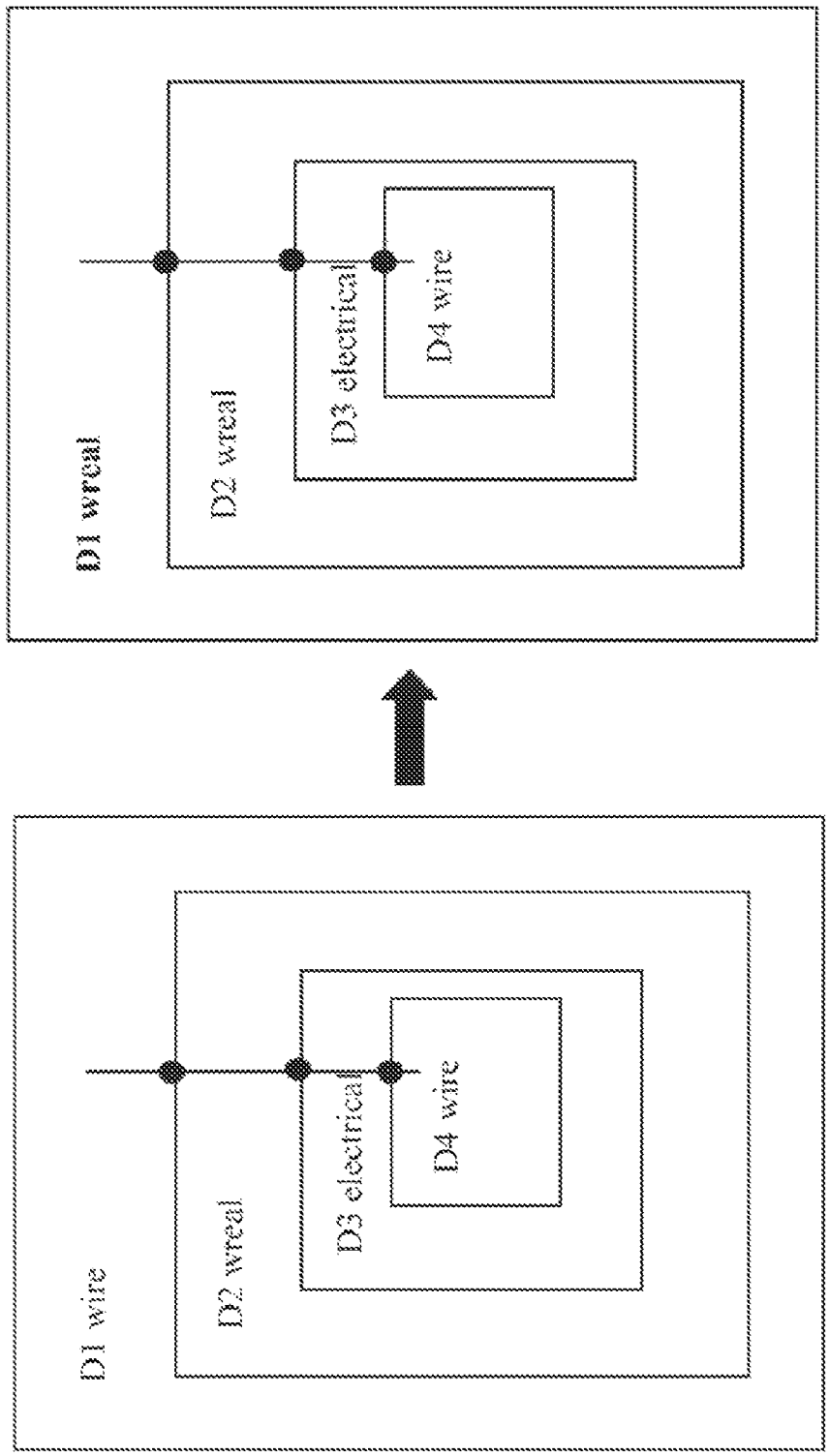

USING REAL VALUE MODELS IN SIMULATION OF ANALOG AND MIXED-SIGNAL SYSTEMS

1. FIELD OF THE INVENTION

The invention relates in general to integrated circuits, and more particularly, to modification of circuit designs to facilitate communication of real number values between circuit design blocks representing an integrated circuit during simulation.

2. DESCRIPTION OF THE RELATED ART

A Real Valued Model (RVM) represents functionality of a circuit design block using real numbers. During RVM simulation, a computer system based discrete event driven (digital) simulation process simulates integrated circuit functionality by computing real number (e.g., floating-point) values based upon RVM design blocks. A circuit design that comprises such models encoded in computer readable storage media represents detailed functional behavior and connectivity of an integrated circuit, and a computer implemented simulation process uses the design to simulate the circuit. Discrete event-driven simulation using a digital solver obviates the need to use slower analog simulation, thus, enabling simulation and verification of a mixed signal design in shorter period of time.

Digital signals are discrete-event signals with discrete values that are at a constant discrete value for a period of time during simulation, and then abruptly change to a new discrete value. Digital signals ordinarily have only few different discrete values, typically two, 'true' and 'false' or logic 'one' and logic 'zero'. In contrast, the value of an analog signal varies continuously meaning that the value of the signal at any point in time during simulation may be any value from within a continuous range of values. An analog signal may be continuous versus time meaning that its value varies smoothly as a function of time. Alternatively, an analog signal may be represented as discrete-event signals that are piecewise constant versus time, meaning that a signal holds its value for a period of time before jumping to a new value.

The simulation of a mixed-signal circuit that includes both digital and analog blocks involves two methods of simulation: event-driven digital simulation as found in logic simulators and continuous-time analog simulation as found in circuit simulators. Digital blocks encoded in computer readable storage media are simulated using digital simulator, and analog blocks encoded in computer readable storage media are simulated using an analog simulator. Digital simulation and analog simulation are fundamentally different. While a digital simulator solves expressions representing logical or functional behavior of a circuit based upon the occurrence of discrete triggering events, an analog simulator solves an analog system matrix representative of Kirchhoff's Laws at each simulation step. Each element in an analog design can have an instantaneous influence on any other element in the matrix and vice versa. As such, analog simulation typically is more complex and requires matrix based computation of complex mathematical equations and therefore takes more time than digital simulation.

RVM uses a real number accuracy and is evaluated using a digital simulator. The values are continuous—e.g., floating-point (real) numbers—as in the analog world. However, time is discrete, meaning that real signals change values based upon discrete events. That is, in an RVM approach, a digital simulator processes real values in an event-driven signal. RVM simulation speed ordinarily is in the range of a typical digital simulation speed and may be orders of magnitude faster than typical analog simulation speed. RVM can be used to gain simulation speed ups by replacing the analog blocks in a design with their Real Valued Models. This allows a digital simulator to simulate the RVM blocks faster than a typical analog simulator could without sacrificing much accuracy.

During an elaboration phase of a circuit simulation process, signal types associated with connections between various design blocks are determined. Circuit blocks may be represented abstractly, and different versions of the same block may exist such as behavioral, gate level or transistor-level versions. Design blocks within a circuit design are connected by nets. For each such component block, signals are defined that correspond to nets and ports of the block. A node is an infinitesimal point of interconnection. A net comprises a name for a node within a particular block of a design. A port is point of connection to a block or a net that traverses a boundary of a block to a next level higher level of the hierarchy.

Signals are values that vary with time and that are passed over nets between blocks during simulation. There are two kinds of signals. Digital signals are computed by a digital simulator and are represented by discrete time domain values. Analog signals are computed by analog simulator and are represented by continuous time domain values.

A 'wire' is a net type in Verilog-AMS Hardware Description Language (HDL). It is typically used to declare nets whose type (analog or digital) is not known. Nets that are 'wire' type are sometimes referred as 'domainless' in that neither an analog nor a digital simulation domain is specified for a wire type net, and it often is left to the simulator to determine during an elaboration phase whether to use analog or digital simulation in connection with signals on such a wire net based upon its usage and connectivity, for example. Wires typically serve as interconnects between various design blocks. The Verilog-AMS HDL also allows for 'disciplines' to be associated with wires (and nets). A discipline can be associated with an interconnect in a design to indicate the simulator 'domain' (i.e. analog or digital) that is to be used to process a signal on such net. Information communicated during simulation over a wire associated with analog discipline is processed by an analog simulator. Information communicated during simulation over a wire associated with a digital discipline is processed by a discrete event-driven simulator. Typically, a signal that represents a continuously varying value such as voltages or currents, is communicated over an interconnect associated with an analog discipline, and a signal that can have only a few discrete values is communicated over an interconnect associated with a discrete or digital discipline.

The Verilog-AMS HDL defines a process called "discipline resolution". Discipline resolution is used to assign the disciplines to various wires/nets in the design based on their connectivity. During discipline resolution pursuant to the Verilog-AMS language is that an electrical (analog) discipline associated with a net propagates up from lower levels of a hierarchical design to higher levels of the design, while a digital discipline associated with a net does not propagate. Another principle is that as between a digital net and an analog net that 'meet' at a node or port in the design, the analog discipline takes precedence, meaning that analog disciplines will also travel from higher levels to lower levels in the hierarchy of a circuit.

Moreover, when a net with analog discipline is connected to net with digital discipline, the discipline resolution process pursuant to the Verilog-AMS language mandates an insertion of a connect module to perform analog to digital (or vice-versa) value conversions. For example, an electric-to-logic connect module converts a continuous changing value at its input to an appropriate discrete logic state at its output, and conversely, a logic-to-electric connect module converts a discrete logic value at its input to an appropriate electrical value at its output.

However, the Verilog-AMS discipline resolution process does not address the needs of mixed-signal design that contains blocks written in HDLs other than Verilog-AMS. For example, when IP blocks from different vendors written in different HDLs are connected in a single design to realize a System-on-a-Chip, the Verilog-AMS discipline resolution process fails to compute the connectivities and identify analog and digital partitions. One prior solution to this problem is to designate a predetermined list of signal types that are allowed at the HDL boundaries. A designer then may be expected to create software wrappers or to change or tweak the circuit blocks or signal types to make such connections work during simulation. Unfortunately, however, changing a circuit block may not be an option since such block may be a protected such as through encryption of a proprietary IP block. Problems with connecting circuit blocks from different HDLs also can arise in the course of RVM simulation.

The 'wreal' type is used to designate a discrete time-domain real-valued net that is used during RVM simulation pursuant to the Verilog-AMS language. For example, the Verilog-AMS, Language Reference Manual, Analog & Mixed-Signal Extensions to Verilog HDL Version 2.3, Aug. 4, 2008, (the "LRM") states that the wreal, or real net data type, represents a real-valued physical connection between structural entities. For example, the LRM specifies that real variables are stored as 64-bit quantities, as described by IEEE std 754-1985, an IEEE standard for double precision floating point numbers.

The LRM states that a wreal net shall not store its value, that a wreal can have at most one driver, and that a wreal net can only be connected to another wreal, a wire or to real-valued expressions. According to the LRM, a wreal wire cannot be connected to any other wires, although connection to explicitly declared 64-bit wires can be done via system tasks $realtobits and $bitstoreal. Compatible interconnect includes nets of type wire, tri, and wreal. The LRM requires that when two nets connected by a port are of net type wreal and wire/tri, the resulting single net will be assigned as wreal. According to the LRM, connection to other net types will result in an error.

Unfortunately, there have been shortcomings with the use of the wreal data type. For example, the LRM limits wreal nets to a single driver source during simulation. However, it may happen that wreal nets in a circuit design are driven by multiple drivers, and the Verilog-AMS LRM does not address problems that may arise when multiple drivers drive signals onto a wreal net.

Other approaches to resolving the value driven onto a net by multiple drivers are known for several other different type nets. For example, a known, prior, simulation process typically resolves a 'wire' type net represented in the Verilog-AMS language, to the strongest driver, and if the strongest drivers have conflicting values, then the value of the wire resolves to 'x' (unknown). Moreover, for a 'wand' type net in the Verilog-AMS, a simulation process resolves the value to 0 if the value of any of the drivers is 0, and for a 'wor' type net, the simulation process resolves the value to 1 if the value of any of the drivers is 1. However, no multiple driver resolution process is specified for wreal type nets.

Moreover, the LRM limits the coercion of a wire type to a wreal type based only on its immediate connectivity, i.e. within the same hierarchical level of a design, to a wreal net type. Also, the LRM does not allow for connections to non-Verilog-AMS blocks. However, as explained above, a design may include design components created using different HDLs. Furthermore, nets at different hierarchical levels of a design, sometimes referred to as different "scopes" of a design, may have different and inconsistent data types associated with them. For example, a net at a lower level of a design may have a wreal type, and a net connected to that lower level net but multiple hierarchical levels up in the same design also may have a wreal type, but intermediate nets in the design connected between the lower and upper wreal nets may be domainless wire nets.

Thus, there has been a need for an improved approach to connecting circuit blocks from different HDLs during RVM. Moreover, there has been a need for a wreal net to receive signals from multiple drivers. The present invention meets these needs.

SUMMARY OF THE INVENTION

In accordance with some aspects of the invention, a value is resolved where multiple drivers drive a wreal net. In some embodiments, computer readable code is provided in computer readable storage medium computer readable to enable a computer system to execute multiple different driver resolution processes. A driver resolution selection process is executed by a computer system to select a driver resolution process from among the multiple different driver resolution processes to apply to a given wreal net in the integrated circuit design that that is coupled to receive values from multiple drivers. In the course of a simulation of the design, the selected driver resolution process is run on the computer system to resolve values driven to the given wreal net by the multiple drivers.

In accordance with other aspects of the invention, non-wreal net is coerced to become a wreal net so as to allow for RVM simulation of an integrated circuit design in which a non-Verilog-AMS RVM design block is connected to a Verilog-AMS RVM design block. In some embodiments, a computer system executes a wreal coercion process that includes an act of identifying a wire type net that is connected to a wreal node in an integrated circuit design and that also includes an act of converting the identified wire type net to a wreal net.

In accordance with yet another aspect of the invention, both a multiple wreal driver resolution process and wreal coercion are used to facilitate simulation of RVM design blocks that are interconnected within a design.

BRIEF DESCRIPTION OF THE DRAWINGS

The aforementioned features and advantages of the invention, as well as additional features and advantages thereof, will be more clearly understandable after reading the detailed description of embodiments of the invention in conjunction with the following drawings.

FIGS. 10A-10B are illustrative block diagrams of a hierarchical second circuit design before (FIG. 10A) and after (FIG. 10B) wreal coercion in accordance with some embodiments of the invention.

DETAILED DESCRIPTION OF EMBODIMENTS

The following description is presented to enable any person skilled in the art to make and use a computer implemented system and method and apparatus to use with analog mixed-signal simulation in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Overview of Wreal Driver Resolution Processes

Figure 1:
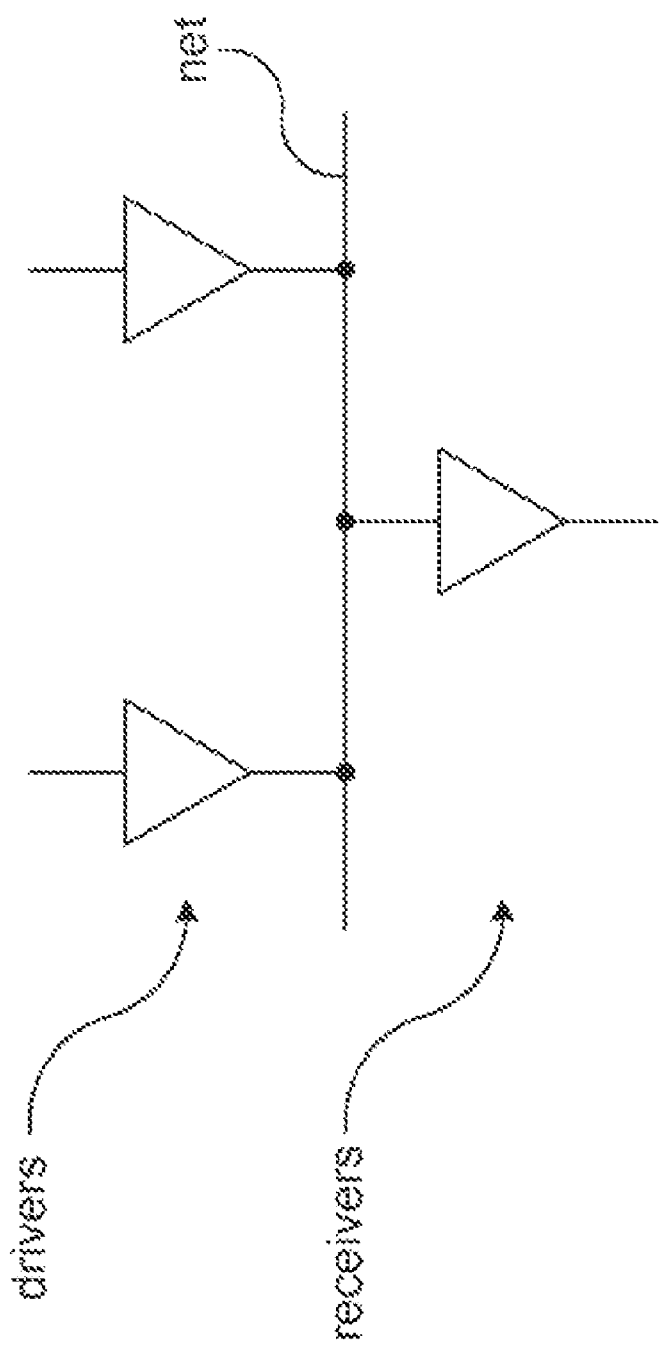
FIG. 1 is an illustrative schematic diagram of a portion of an integrated circuit design that includes a net connected to multiple drivers and to a receiver.

FIG. 1 is an illustrative schematic diagram of a portion of an integrated circuit design that includes a net connected to multiple drivers and to a receiver. For a 'wreal' data type net, a computer system configured to execute a wreal driver resolution process during in accordance with some embodiments of the invention, resolves values driven onto a net by the multiple drivers in the circuit design. A wreal value driver resolution process in accordance with some embodiments permits a designer to select the manner in which a wreal value result is resolved. For example, if a designer wants to treat all wreal values as "voltage" values, it would be an error to have two wreal drivers driving the net with different values. In an analog sense, this would be equivalent to driving two different voltage sources at the single node in violation of Kirchoff's Voltage Law (KVL). On the other hand, for example, if a designer wanted to treat all the wreal values as "current" values, then the multiple values driven by the multiple drivers should be added together to comply with Kirchoff's Current Law (KCL) when multiple wreal drivers values are resolved. Moreover, a designer may require different driver resolution semantics for wreals for different blocks of an overall design.

In accordance with some embodiments of the invention, a list of pre-defined computer implemented driver resolution processes is provided in computer readable storage media from which a designer can choose. Moreover, a method in accordance with some embodiments of the invention permits a designer to selectively map a computer implemented wreal driver resolution process to Verilog-AMS disciplines, and then to use Verilog-AMS discipline resolution to determine the driver resolution process applicable to a wreal nets within a design. Such Verilog-AMS to wreal-driver resolution process mapping enables the designer to propagate the driver resolution function information to various parts of the design through a Verilog-AMS discipline resolution processes and also through pre-defined commands/options that enable setting of disciplines (and, in turn, driver resolution processes) on larger blocks/scopes of the design such as libraries, instances, and cells etc.

FIG. 1 is used below as a basis for examples set forth below of voltage semantics based wreal driver resolution (consistent with KVL), current semantics wreal driver resolution (consistent with KCL) and an exemplary averaging wreal driver resolution in accordance with some embodiments of the invention. The term "semantics" refers to the rules used by the simulator used to implement the simulation process, which in the case of an interconnect in a circuit design, include rules for resolving values based upon data type associated with the interconnect. In the examples below, a wreal1 value is driven onto a wreal net by the first driver connected to the net. A wreal2 value is driven onto the same wreal net by the second driver connected to the net. The resolved value represents a driver resolution of the wreal1 and wreal2 values according to the wreal voltage semantics, wreal current semantics or wreal averaging driver resolution function as described below.

Example: wrealXState and wrealZstate

In accordance with some embodiments of the invention, values referred to herein as 'wrealZState' and 'wrealXState' are used to represent an "X" (undefined) state and a "Z" (high impedance) state, respectively during a computer implemented simulation process. In some embodiments, the wrealZState is associated in a design with a behavior analogous to that of the hiZ (high impedance) discrete logic state, and signifies a 'no-op' (no operation) state in which a driver does not participate in driving a value onto a net. One representation of the wrealZState within a simulation process, for example, is a bit pattern such as, 0xFFFFFFFF00000000" (i.e., an IEEE 'Not-a-Number' representation). In some embodiments, the wrealXState is associated with a behavior like that of the X state (unknown) in discrete logic. The wrealXState can be used as the resolved value for a wreal net if a resolved value can not be determined for the wreal net. The numerical value of the wrealXState within a simulation process, for example, can be any IEEE 'NaN' that does not have the bit pattern of the wrealZState (0xFFFFFFFF00000000). In some embodiments, both, wrealXState and wrealZState can be referenced in Verilog-AMS models using 'wrealXState' and 'wrealZState'.

These states can be referenced anywhere in the source code encoded in computer readable storage media where a typical compiler directive is allowed. In addition, these states can be used in signal driver resolution processes as explained below. More particularly, the wrealZState and wrealXState can be associated with a wreal digital (i.e. discrete-event) signal to indicate the unknown state or the high impedance state. In the wreal data type context, an "unknown state" signifies a state in which the output cannot be unambiguously determined. For example, the designers may want to illustrate a signal state in which they do not want to assign any explicit value. In the wreal data type context, a 'no-op' signifies a state that does not assign/drive any value and lets other values pass through. For example, assume that there are two drivers driving a single receiver, and the design calls for only one driver at a time driving a value to the receiver, then when one driver drives a value, the other driver is maintained in a high impedance state. These values can be directly accessed by a simulation process from the behavioral design code that is stored in computer readable storage media to perform the inter-domain translations during simulation.

Table 1 sets forth a code fragment that can be encoded in computer readable storage media that provides an illustrative Verilog-AMS model that specifies both the wrealXState and wrealZState.

TABLE 1

```
wreal a;
initial begin
    if ( wreal :======::=== 'wrealZState)
        $display ("Net a is in high impedance state");
    else if (wreal ===:======: 'wrealXState)
        $display ("Net a is in unknown state");
end
```

Example: Conversion Between Wreal and Analog Involving wrealXState and wrealZState Table 2 provides HDL code in the Verilog-AMS language that defines a connect module that can be stored in a computer readable storage medium and that can configure a computer implemented simulation process to take in a wreal (digital) value and convert it to its analog equivalent in accordance with some embodiments of the invention. The statement "wreal Din" in the code below indicates that the input value to the connect module is a discrete wreal value that has been computed using digital simulation. The statement "electrical Aout" indicates that analog simulation is to be used to compute the output value, which is continuous rather than discrete. More particularly, the example Verilog-AMS R2E connect module code shows states used in the behavioral code to detect the unknown state and the high impedance state of the wreal signal and to define the analog voltages accordingly. Notice the use of wrealXState and wrealZState and how they part in defining the inter-domain value conversion between digital and analog domains.

TABLE 2

```
'include "disciplines.vams"
'timescale 1 ns / 100ps
connectmodule R2E_2 (Din, Aout);
    input Din;
    wreal Din; // input wreal
    \logic Din;
    output Aout;
    electrical Aout; // output electrical
    parameter real vsup = 1.8         from (0:inf); // supply voltage
    parameter real vdelta = vsup/64   from (0:vsup]; // voltage delta
    parameter real vx = 0             from [0:vsup]; // X output voltage
    parameter real vz = vx            from [0:vsup]; // Z output voltage
    parameter real tr = 10p           from (0:inf); // risetime of analog output
    parameter real tf = tr            from (0:inf); // falltime of analog output
    parameter real ttol_t = (tr+tf)/20 from (0:inf); // time tol of transition
    parameter real tdelay = 0         from [0:inf); // delay time of analog
                                                   output
    parameter real rout = 200         from (0:inf); // output resistance
    parameter real rx = rout          from (0:inf); // X output resistance
    parameter real rz = 10M           from (0:inf); // Z output resistance
    real Vstate, Rstate;
    real Vout, Rout;
    initial begin
        if (Din === 'wrealXState)
            begin Vstate = vx; Rstate = rx; end
        else if (Din === 'wrealZState)
            begin Vstate = vz; Rstate = rz; end
        else
            begin Vstate = Din; Rstate = rout; end
    end
    always @(Din) begin
        if (Din === 'wrealXState)
            begin Vstate = vx; Rstate = rx; end
        else if (Din === 'wrealZState)
            begin Rstate = rz; end
        else if (Din-Vstate >= vdelta || Vstate-Din >= vdelta)
            begin Vstate = Din; Rstate = rout; end
    end
    assign Din = Din;
    analog begin
        Vout = transition(Vstate, tdelay, tr, tf, ttol_t);
        Rout = transition(Rstate, tdelay, tr, tf, ttol_t);
        I(Aout) <+ (V(Aout) – Vout) / Rout;
    end
endmodule
```

Voltage Semantics Based Driver Resolution Process

A computer implemented, first, voltage semantics based driver resolution process in accordance with some embodiments is performed using a computer system programmed to implement the process described as follows. In this example embodiment, the voltage semantics based driver resolution serves as a default multiple driver resolution process. Such default driver resolution process is used, for example, if a designer fails to specify a different driver resolution function. The illustrative voltage semantics based driver resolution process is useful for modeling wreal numbers as voltage values during simulation since it prevents different drivers from driving different values onto a wreal net. Persons skilled in the art will be appreciate that the existence of different voltages onto the same node violates KVL. A computer configured in accordance with some embodiments of the invention implements a voltage semantics based default driver resolution process as follows, in the course of simulation using an integrated circuit design.

Figure 2:
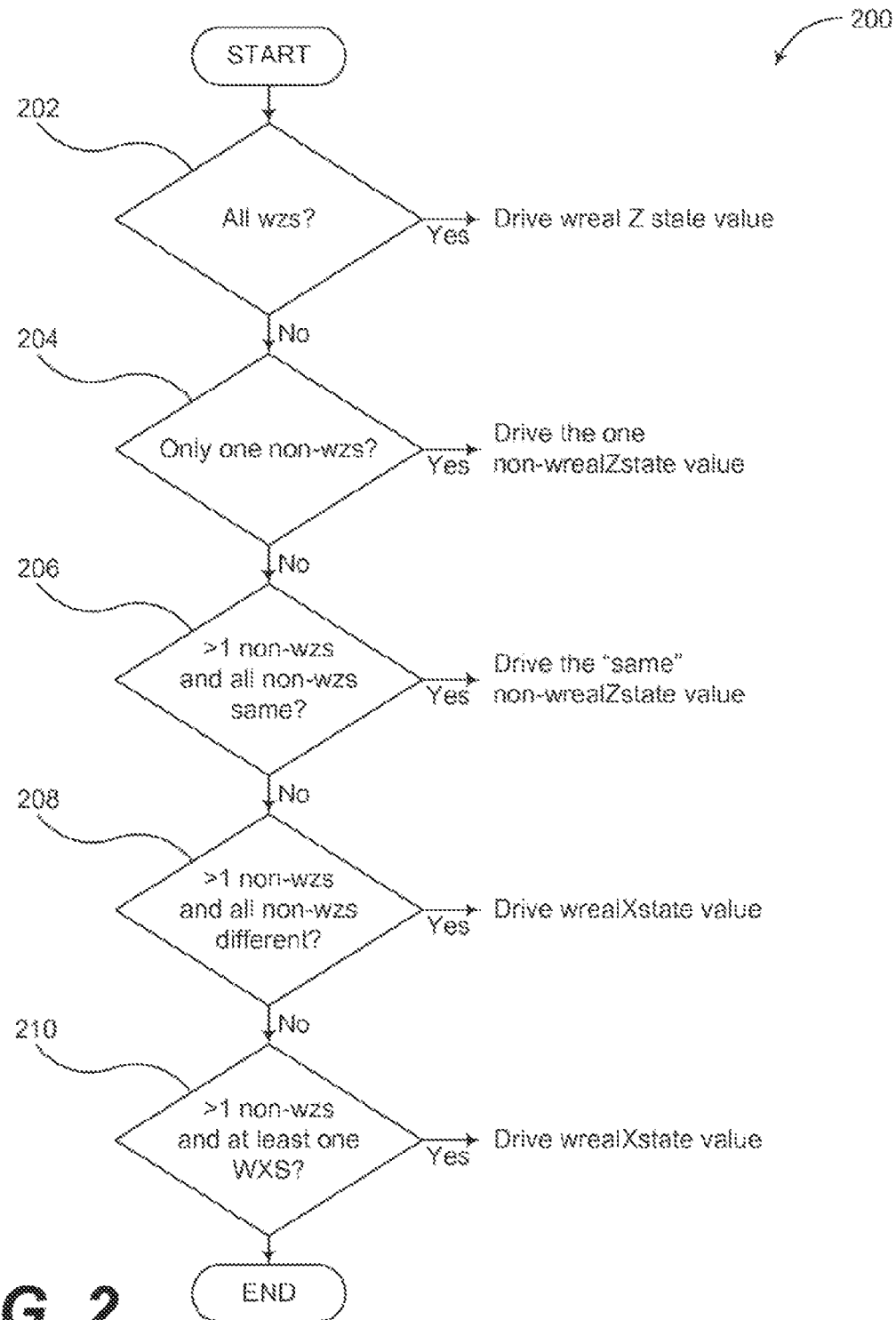
FIG. 2 is an illustrative flow diagram of a first wreal net driver resolution process in accordance with some embodiments of the invention to resolve multiple drivers driving a wreal net.

FIG. 2 is an illustrative flow diagram of a first wreal net driver resolution process 200 in accordance with some embodiments of the invention to resolve multiple drivers driving a wreal net. A computer system is configured to execute computer instructions to implement the first process to determine a value driven onto a wreal net during simulation of an integrated circuit. It will be understood that each block in the flow diagram represents a code module in a computer program stored in computer readable storage media to cause a computer system to implement the first driver resolution process 200. In module 202, if all drivers drive wrealZState, then drive all receivers with wrealZState. In module 204, if there is exactly one (1) driver that drives a non-wrealZState, then drive all receivers with the only non-wrealZState value. In module 206, if more than one (1) driver drives a non-wrealZState value, and if all non-wrealZState drivers drive the same value, then drive the receivers with that value, and report a detailed run-time warning with all drivers and their values. In module 208, if all non-wrealZState drivers drive the same value, then drive the receivers with that value, and if any non-wrealZState driver drives different values from each other, drive the receivers with wrealXState and report a detailed run-time warning with all drivers and their values. In module 210, if all non-wrealZState drivers drive the same value, then drive the receivers with that value, and if there is a at least one driver that drives a wrealXState, then drive the receivers with wrealXState Table 3 illustrates an example of operation of a voltage semantics based driver resolution process as described above.

TABLE 3

| Wreal1 | Wreal2 | Resolved Value |
|---|---|---|
| wrealZState | wrealZState | wrealZState |
| 1.25 | wrealZState | 1.25 |
| 1.25 | 1.25 | 1.25 (with a warning) |
| 1.25 | 1.33 | wrealXState (with a warning) |
| wrealXState | 1.33 | wrealXState |
| wrealXState | wrealZState | wrealXState |

Current Semantics Based Driver Resolution Function

A computer implemented, second, current semantics based driver resolution process in accordance with some embodiments is performed using a computer system programmed to implement the process described as follows. The summation driver resolution process resolves to the summation of all the drivers, ignoring wrealZState drivers. The illustrative current semantics based driver resolution process is useful for modeling wreal numbers as current values during simulation. Persons skilled in the art will be appreciate that summation of current values is consistent with KCL. Also, if any drivers drive wrealXState the resolved value will be wrealXState. Nets driving wrealZState will not contribute to the resolved value. If all nets drive a wrealZState the resolved value will be wrealZState. A computer configured in accordance with some embodiments of the invention implements a summation driver resolution process as follows, in the course of simulation using an integrated circuit design.

Figure 3:
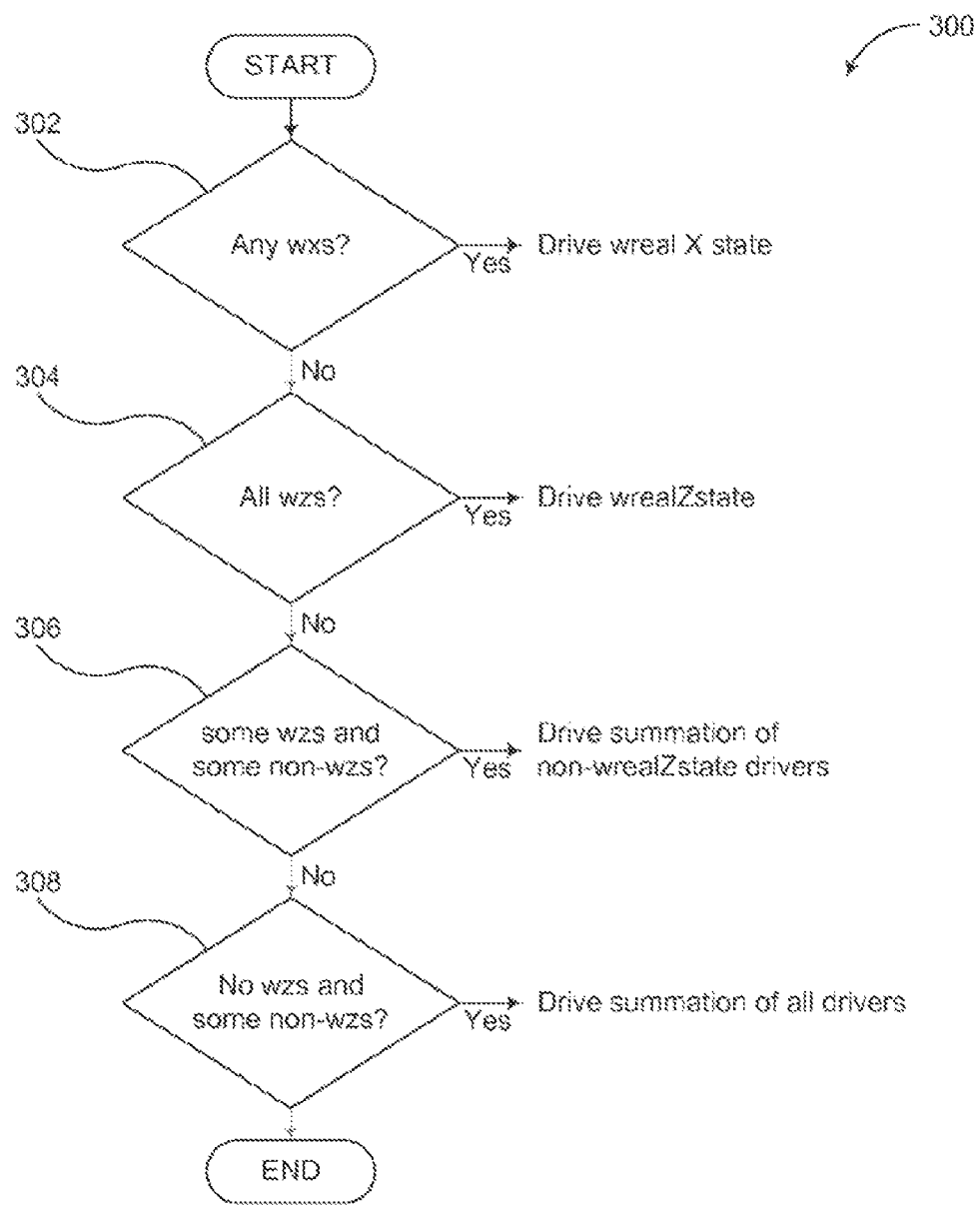
FIG. 3 is an illustrative flow diagram of a second wreal net driver resolution process in accordance with some embodiments of the invention to resolve multiple drivers driving a wreal net.

FIG. 3 is an illustrative flow diagram of a second wreal net driver resolution process 300 in accordance with some embodiments of the invention to resolve multiple drivers driving a wreal net. A computer system is configured to execute computer instructions to implement the second process to determine a value driven onto a wreal net during simulation of an integrated circuit. It will be understood that each module in the flow diagram represents a code module in a computer program stored in computer readable storage media to cause a computer system to implement the second driver resolution process 300. In module 302, if any of the drivers drives wrealXState, then drive the receivers with wrealXState. In module 304, if all of the drivers drive wrealZState, then drive the receivers with wrealZState. In module 306, if any of the drivers drives wrealZState, then drive the receivers with the summation of all the non-wrealZState drivers (i.e., ignore wrealZState drivers). In module 308, if none of the drivers drives wrealZState, then drive the receivers with the summation of all the drivers.

Table 4 illustrates an example of operation of a summation driver resolution process as described above.

TABLE 4

| Wreal1 | Wreal2 | Resolved Value |
|---|---|---|
| wrealZState | wrealZState | wrealZState |
| 1.25 | wrealZState | 1.25 |
| 1.25 | 1.25 | 2.50 |
| 1.25 | 1.33 | 2.58 |
| wrealXState | 1.33 | wrealXState |
| wrealXState | wrealZState | wrealXState |

Averaging Driver Resolution Process

A computer implemented averaging driver resolution process in accordance with some embodiments is performed using a computer system programmed to implement the process described as follows. The averaging driver resolution process resolves to the average of all the drivers, ignoring wrealZState drivers. If any drivers are driving wrealXState the resolved value will be wrealXState. Nets driving wrealZState will not contribute to the resolved value. If all nets drive the wrealZState the resolved value will be wrealZState. A computer configured in accordance with some embodiments of the invention implements an averaging driver resolution process as follows, in the course of simulation using an integrated circuit design.

Figure 4:
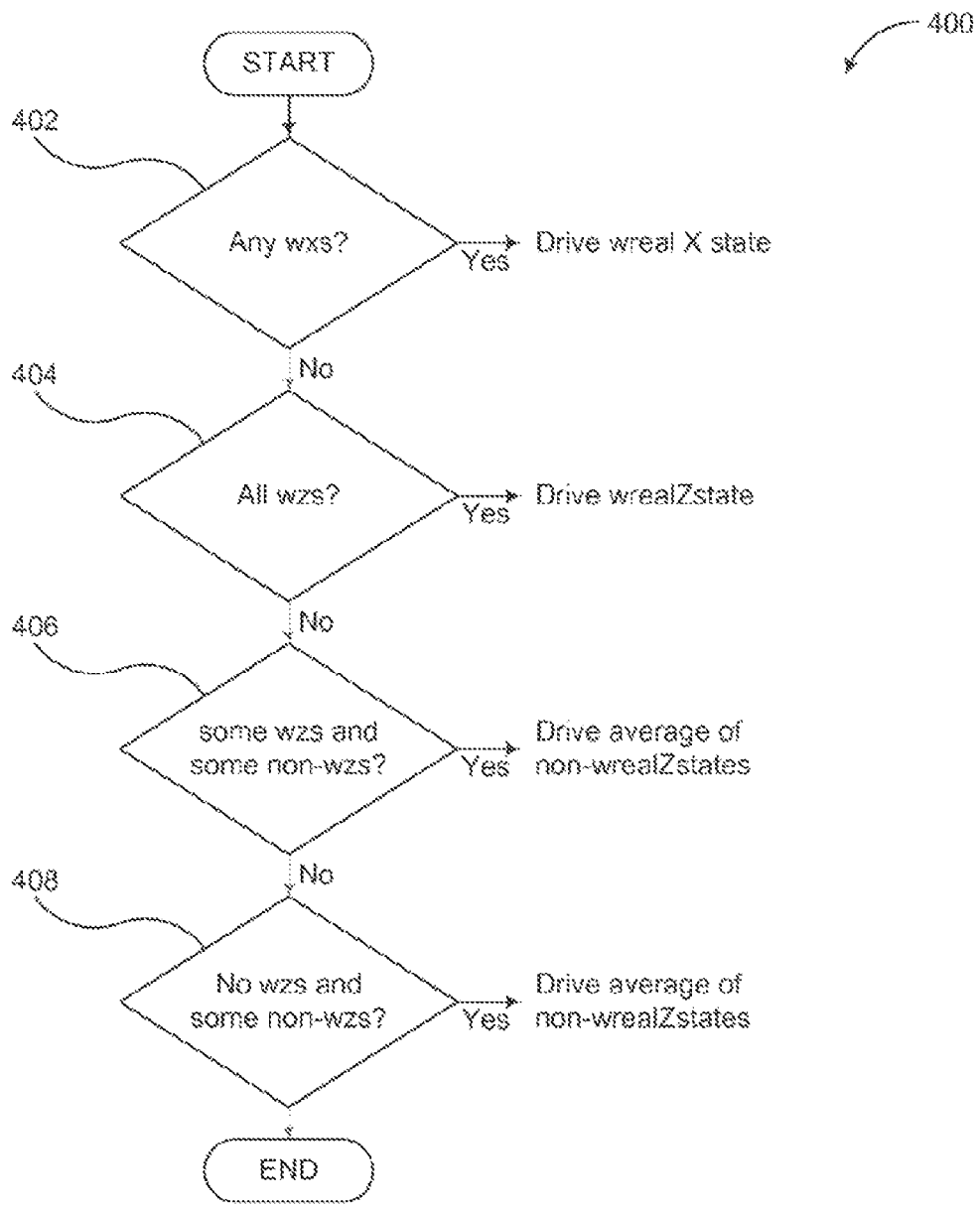
FIG. 4 is an illustrative flow diagram of a third wreal net driver resolution process in accordance with some embodiments of the invention to resolve multiple drivers driving a wreal net.

FIG. 4 is an illustrative flow diagram of a third wreal net driver resolution process 400 in accordance with some embodiments of the invention to resolve multiple drivers driving a wreal net. A computer system is configured to execute computer instructions to implement the third process to determine a value driven onto a wreal net during simulation of an integrated circuit. It will be understood that each block in the flow diagram represents a code module in a computer program stored in computer readable storage media to cause a computer system to implement the third driver resolution process 400. In module 402, if any of the drivers drives wrealXState, then drive the receivers with wrealXState. In module 404, if all of the drivers drive wrealZState, then drive the receivers with wrealZState. In module 406, if any of the drivers drives wrealZState, then drive the receivers with the average of all the non-wrealZState drivers (i.e, ignore wrealZState drivers). In module 408, if none of the drivers drives wrealZState, then drive the receivers with the average of all the drivers.

Table 5 illustrates an example of operation of a average driver resolution process as described above.

TABLE 5

| Wreal1 | Wreal2 | Resolved Value |
|---|---|---|
| wrealZState | wrealZState | wrealZState |
| 1.25 | wrealZState | 1.25 |
| 1.25 | 1.25 | 1.25 |
| 1.25 | 1.33 | 1.29 |
| wrealXState | 1.33 | wrealXState |
| wrealXState | wrealZState | wrealXState |

While example driver resolution processes involving voltage semantics, current semantics and averaging are set forth above, it will be appreciated that other driver resolution processes can be provided such as a minimum driver resolution function in which a minimum wreal value driven onto a net is receive by a receiver. Alternatively, for example, a 'maximum' driver resolution process can be provided in which a maximum wreal value driven onto a net is receive by a receiver.

Selection from Among Driver Resolution Processes

In accordance with some embodiments, a designer can select from among associations or mappings of different driver resolution functions for Verilog-AMS wreals by, A. defining a single default driver resolution for an entire design;

B. defining an external configuration file that provides information on the discipline to driver resolution function mapping; or C. defining Verilog-AMS disciplines and driver resolution function mappings and then using discipline information to apply driver resolution functions to various parts of a design.

Defining a single driver resolution function to be mapped to the whole design can be done by selecting a computer implemented elaboration process (wreal driver resolution') in accordance with some embodiments. According to this option, during an elaboration phase of a computer implemented simulation process, a selected driver resolution process (e.g., one of voltage semantics, current semantics or averaging) is mapped to every wreal type net for which driver resolution is required. That is, every wreal type net that is driven by more than one driver will use the same driver resolution process, whichever one a designer has designated for the whole design. The driver resolution function specified this way is also considered as a default driver resolution function unless it is overridden by one of the following techniques.

A configuration command data structure external map can be provided in accordance with some embodiments that allows for the disciplines to be mapped to driver resolution functions. An example of the use of a external map structure is provided through the "amsd" command described in commonly owned U.S. patent application Ser. No. 12/399,855, filed Mar. 6, 2009, entitled, Method and Apparatus for AMS Simulation of Integrated Circuit Design, which is expressly incorporated herein by this reference. Table 6 sets forth an example user-defined external configuration file with a external map data structure that can be encoded in computer readable storage media to cause a computer implemented simulation process to define the driver resolution function "avg" for Verilog-AMS disciplines disc1, disc2 and disc3 and to define "sum" as a default resolution process 'for all other disciplines.

TABLE 6

```
map resolve=sum
map discipline="disc1 disc2 disc3" resolve=avg
```

In accordance with the example configuration file of Table 6, when a computer system running an elaboration phase of a simulation on a design that includes the configuration instructions of Table 6 encounters wreal drivers in the design with any of the disciplines disc1, disc2 or disc3 connected to each other, the resolved value will follow the "averaging" driver resolution function.

Table 7 sets forth example of computer program instructions that can be encoded in computer readable storage media to map (i.e. or associate) a driver resolution function to a discipline within a design to cause a computer system running an elaboration phase of a simulation to perform a driver resolution process in the course of a discipline resolution process in accordance with some embodiments of the invention is provided in Table 7.

The map data structure specified in Table 6 can be provided to the simulator through an external configuration file, which a designer may use to dictate the type of signals associated with nets in a design. The discrete discipline definitions explained in Table 7 are provided through Verilog-AMS files that are used to describe the design to be simulated. The external map data structures get the first precedence as these allow the information to be changed/configured without having to alter the input design (Table 7) information. That is, the external external map data structure may override a discipline definitions defined in the actual design. This is an advantage since often times users come across the "read-only" designs/libraries/models that cannot be altered/changed/re-configured for the purpose of simulation.

TABLE 7

```
discipline disc1
    domain discrete;
    realresolve sum; // wreal driver resolution specification
enddiscipline
discipline disc2
    domain discrete;
enddiscipline
discipline disc3
    domain discrete;
    realresolve none;
enddiscipline
module foo;
    wreal a;
    disc1 a;
    // Net "a" becomes a wreal net
    // with "sum" driver resolution function
    ...
    ...
endmodule
```

In the example declared driver resolution function of Table 7, the discipline "disc1" has the wreal driver resolution function "sum" attached to it. However, "disc2" does not have any driver resolution function and "disc3" is explicitly declared with driver resolution function "none". In this example, not declaring a driver resolution function is same as defining it as "none". The nets with disciplines with no driver resolution function attached (i.e. "disc2") or defined as "none" (i.e. "disc3") get the driver resolution function from the disciplines of the nets that are attached to in a direct or indirect way. If during elaboration, the driver resolution function cannot be determined from the connections, a default/global driver resolution function specified through -wreal resolution option above is used.

Alternatively, for example, a designer may map driver resolutions to disciplines through command statements as shown in the following Table 8 follows.

TABLE 8

```
external map realresolve =avg
external map discipline ="disc1" realresolve = sum
external map discipline ="disc3" realresolve = none
```

The disc1 is set to have "sum" driver resolution function, disc3 has "none". The discipline disc2 is not specified here so it is assumed to have no declared driver resolution function.

Figure 5:
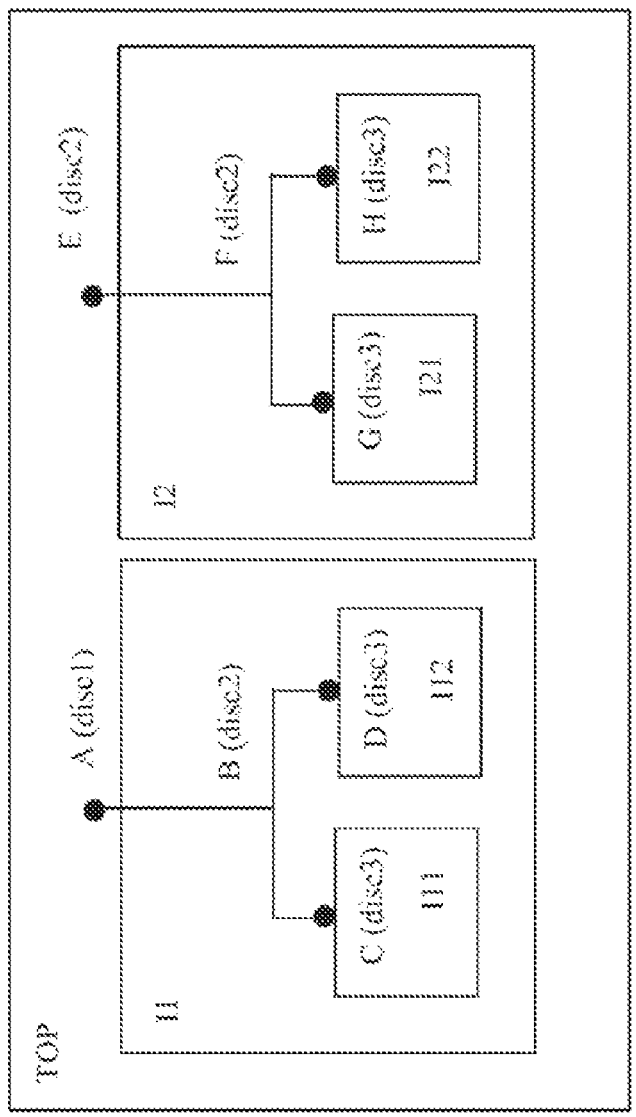
FIG. 5 is an illustrative hierarchical circuit design block diagram to illustrate a wreal driver resolution process in accordance with some embodiments of the invention.

Defining Verilog-AMS Disciplines and Driver Resolution Function Mappings and Using Discipline Information to Apply Driver Resolution Functions to Various Parts of a Design FIG. 5 is an illustrative hierarchical circuit block diagram to illustrate a wreal driver resolution process in accordance with some embodiments of the invention. The circuit design, which represents an integrated circuit, is encoded in computer readable storage media. The circuit design includes a circuit design "TOP" level that includes blocks I1 and I2. I1 instantiates next level blocks I11 and I12, and i2 instantiates next level blocks I21 and I22 respectively. The design contains wreal nets A, B, C, D, E, F, G and H in various blocks as shown above. It is assumed that disciplines, which have been resolved already are associated with the nets as indicated next to the net names.

Figure 6:
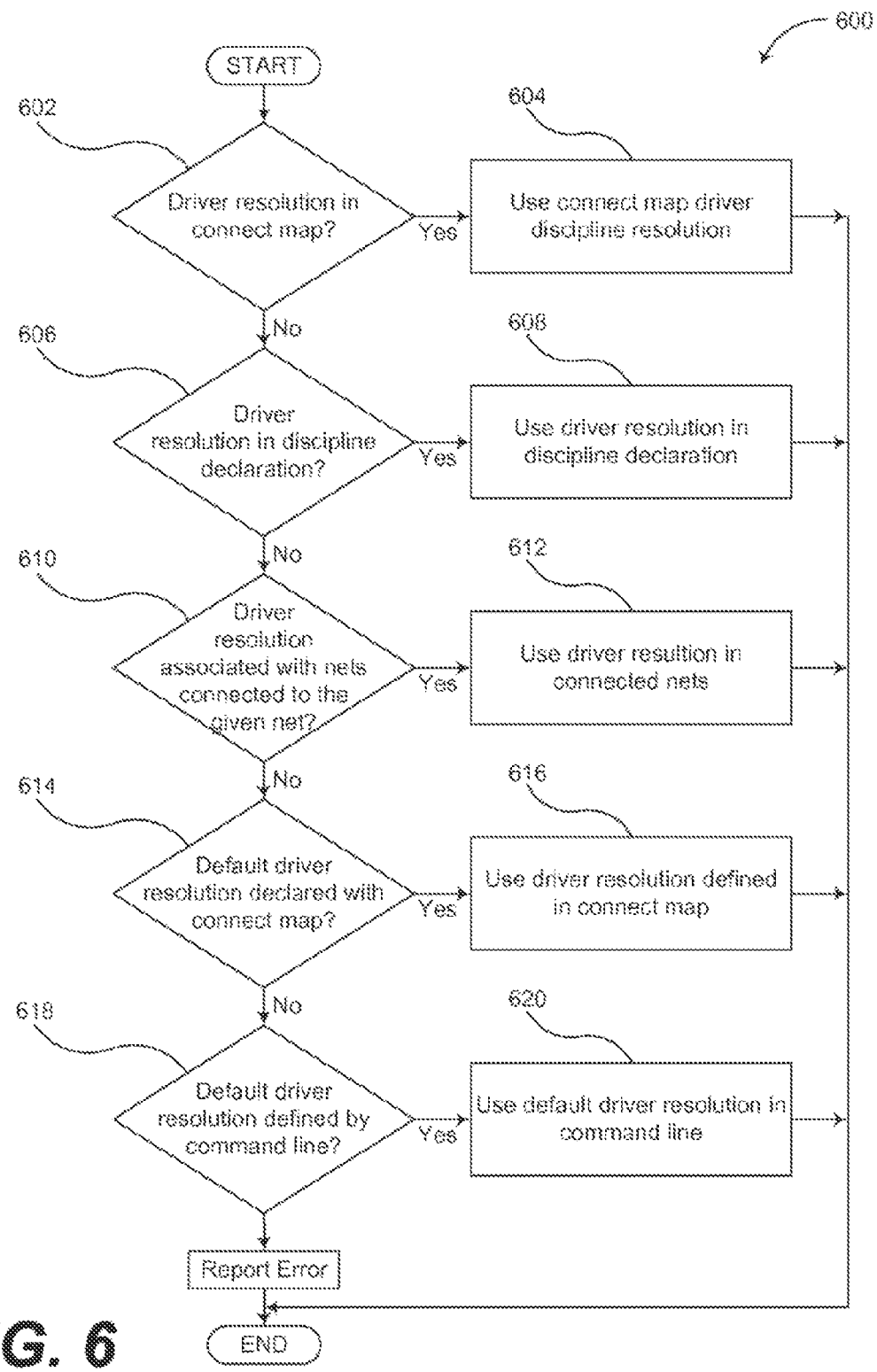
FIG. 6 is an illustrative flow diagram of a process to associate driver resolution functions with wreal nets based upon those nets' mappings to Verilog-AMS disciplines in accordance with some embodiments of the invention.

FIG. 6 is an illustrative flow diagram of a process 600 to associate driver resolution functions with wreal nets based upon those nets' mappings to Verilog-AMS disciplines in accordance with some embodiments of the invention. A computer system is configured to execute computer instructions to implement the process 600. It will be understood that each block in the flow diagram represents a code module in a computer program stored in computer readable storage media to cause a computer system to implement the process 600.

The process 600 of FIG. 6 is performed for each given wreal net in the example circuit of FIG. 5. the process 600 maps driver resolution functions to nets according to a priority in which the following precedence order applies:

1. driver resolution within configuration file declared for discipline associated with the given net.
2. driver resolution within discipline statement associated with the given net.
3. driver resolution within discipline associated with net connected to the given net.
4. default driver resolution defined within the configuration file.
5. driver resolution defined within command line.

Decision module 602 determines whether a given wreal net has a driver resolution function mapped to the discipline associated with the given net from a configuration file, also referred to herein as a external map data structure. If so, then module 604 associates the configuration file's driver resolution function with the given net. If not, then decision module 606 determines whether there is a declared driver resolution function mapped to a discipline declaration associated with the given wreal net. If so, then module 608 associates the driver resolution function defined in the discipline declaration with the given wreal net. If not, then decision module 610 determines whether another net connected to the given net is associated with a discipline that has a driver resolution function associated with it. If so, then module 612 associates the driver resolution process of that other net with the given net. If not, then decision module 614 determines whether a configuration file defines a default driver discipline. If so, then module 616 associates the configuration file default discipline with the given net. If not, then decision module 618 determines whether a command line statement defines a default driver resolution function applicable to the given net. If so, then the module 620 associates the command line driver resolution function with the given net if not, then module 622 declares an error.

The process of FIG. 6 will be better understood by reference to the example hierarchical design of FIG. 5. In this example, the driver resolution mappings to disciplines of Table 7 apply, and a configuration file (not shown) does not declare driver resolutions for any of the discipline associated with the illustrated nets, but it does declare a default driver resolution process of "avg". The nets B, C and D have disciplines disc2 and disc3 associated with them. The disciplines disc2 and disc3 do not have any wreal driver resolution functions. The wreal net A is connected to B and, in turn, to C and D is associated with a discipline disc1. The discipline disc1 contains a driver resolution function "sum". Thus, in accordance with module 612, the nets B, C and D are mapped to so as to be associated with the driver resolution function "sum" due to their connectivity to A. The nets E, F, G and H are mapped to so a as to be associated with disciplines disc2 or disc3, which do not have any driver resolution function. It is not possible to get the wreal driver resolution function based on the connectivity of these nets. Therefore, in accordance with module 616, the default driver resolution function specified by "wreal resolution" are associated with nets E, F, G and H. In this example, it is "avg". So, the nets E, F, G and H will use the driver resolution function "avg".

It will be appreciated that disciplines typically are used to determine the connect modules at the analog-digital boundaries. Thus, in accordance with some embodiments of the invention, if a designer wants inter analog-digital value conversion to be done by treating wreal values as voltage in certain portions of a mixed-signal design, the designer can associate a voltage related driver resolution function with the disciplines in that portion of the design, for example. Conversely, for example, if a designer wants inter analog-digital value conversion to be done by treating wreal values as currents in portions of a mixed-signal design, the designer can associate a current related driver resolution function with the disciplines in that portion of the design. Therefore, a designer can configure a mixed-signal design by associating different disciplines with different blocks of the design and then treating wreal values differently (e.g. currents in some blocks while voltage in others) for inter domain (analog and digital) value conversion.

Moreover, it will be appreciated that that in the above example precedence flow, the highest precedence is given to the external map data structure, which allows users to override the information provided in the design itself. This precedence allows designers to configure the simulation runs without changing the actual design. Often, designers are not permitted to change actual design blocks since different designs may come from different vendors/design teams and may be encrypted or read-only. The default driver resolution has lowest precedence. Such external configuration makes it possible to configure the simulation of a design despite a designer's inability to change a design.

Figure 7:
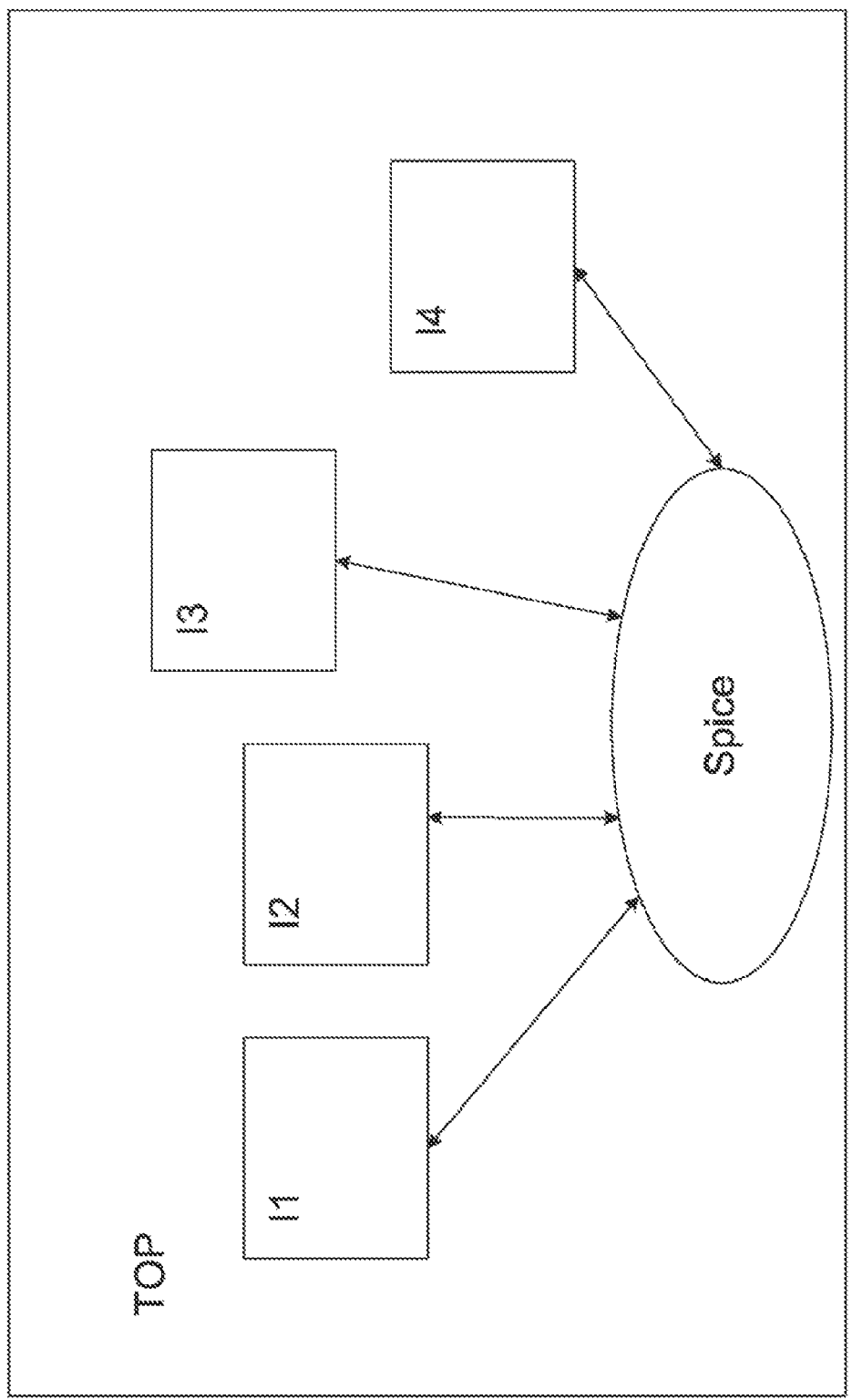
FIG. 7 is an illustrative hierarchical circuit design block diagram to illustrate a wreal driver resolution process in which wreal driver resolution is targeted to a desired hierarchical level of a design in accordance with some embodiments of the invention.

FIG. 7 is an illustrative hierarchical circuit design block diagram to illustrate a wreal driver resolution process in which wreal driver resolution is targeted to a desired hierarchical level of a design in accordance with some embodiments of the invention. Assume that some of the circuit design blocks in the illustrative design are to be simulated using wreal values modeled as "currents" while the other circuit blocks in the design are to simulated using wreals values to be simulated as "voltages". Assume that blocks I1, I2, I3 and I4 contain wreal digital nets. Further, assume that blocks I1 and I4 require their wreal values to be treated as currents, and that I2 and I3 require their wreal values to be treated as voltages. Table 9 illustrates disciplines code that can be stored in computer readable storage medium to configure a computer system to achieve this result during an elaboration phase of a computer implemented simulation using the integrated circuit design represented by the diagram of FIG. 7.

TABLE 9

```
discipline mycurrent;
    domain discrete;
    realresolve sum; // "sum" follows current semantics
enddiscipline
discipline myvoltage
    domain discrete;
    realresolve default; // "default" follows voltage semantics
enddiscipline
```

Assume that a designer applies the discipline "mycurrent" to the blocks I1 and I4 using "scope-based discipline settings" (i.e. settings that indicate the level of a design hierarchy at which a discipline is to be applied) as follows:

-setdiscipline "inst-top.I1- mycurrent" -setdiscipline "inst-top.I4- mycurrent"

Assume that a designer applies the discipline "myvoltage" on the blocks I2 and I3 as follows:

-setdiscipline "inst-top.I2- myvoltage" -setdiscipline "inst-top.I3- myvoltage"

Commonly owned U.S. patent application Ser. No. 11/699, 881 entitled Analog/Digital Partitioning of Circuit Designs for Simulation, which is incorporated herein by this reference, sets forth a process for improved control over the resolution of disciplines at different levels of a design hierarchy. A discipline resolution process disclosed in the Ser. No. 11/699, 881 application can be used to associate disciplines with design components at different levels of a design hierarchy, and the driver resolutions within these disciplines can be used as described herein.

Once the disciplines are applied, the computer system can be configured to run a driver resolution process in accordance with the declared disciplines causes all the wreals nets within the scope (hierarchical design level) of I1 and I4 to follow "mycurrent" driver resolution, and causes all nets within the scope (hierarchical design level) of I2 and I3 will follow "myvoltage" driver resolution.

In addition, such driver resolution process, the connection of I1 and I4 blocks with spice (i.e. analog) will automatically insert and use "mycurrent to electrical" and "electrical to mycurrent" connect modules (not shown). These modules can be programmed to treat wreal values as current when passing onto analog (electrical) side.

Similarly, I2 and I3 will automatically insert and use "myvoltage to electrical and "electrical to myvoltage" connect modules (not shown). These can be programmed to use wreal values as voltage.

Since the driver resolution functions are associated with the discipline, the rest of the connect module selection and insertion scheme works automatically using Verilog-AMS LRM semantics.

Thus, the circuit design is partitioned using disciplines that allow for different driver resolutions functions to be applied and to use this information to interact with Spice blocks as well.

Selection and Insertion of Connect Modules

The Verilog-AMS language provides "connect rules" to define and control the selection of connect modules that perform the conversion of values from digital to analog and vice versa. In general, a selection of connect modules is done based on following criteria:

Direction of the port of the lower connection

Discipline (property) of analog and digital nets connected to each other.

However, the above selection criteria are not sufficient for support wreal based connect modules since the use of only a discipline and a port direction for connect module generation cannot differentiate between a non-wreal digital net with analog versus a wreal digital net with analog. Accordingly, to make these connect rules work with wreals, enhanced connect rules are provided in accordance with some embodiments to consider the value type of the nets as well. This allows for the use of "wreal" nets in the connect rules and selection of appropriate "wreal-to-analog" or "analog-to-wreal" connect modules.

The example connect structures in Table 10 use the exact same disciplines and directions. However, the exact selection of the connect module is made based on the "value-type" of the digital net. If a wreal is connected to electrical (analog) net, R2E will be used. If a non-wreal digital net is connected to electrical (analog), L2E will be used.

TABLE 10

```
connectrules myConnRules;
// L2E uses logic non-wreal port for digital
connect L2E input logic output electrical;
// R2E uses logic wreal port for digital
connect R2E input logic output electrical;
endconnectrules
```

Overview of Weal Coercion

Wreal coercion in accordance with some embodiments of the invention is employed when porting real number models into designs containing legacy models or models written in different HDLs. For example, wreal coercion allows connections involving legacy digital verilog libraries with "wire" signal types, VHDL libraries containing real typed signals or System-Verilog libraries real data types. In accordance with some embodiments, when a VHDL-D real typed signal or System-Verilog real signal or Verilog-AMS wreal is directly connected to a verilog wire, it is forced to become "wreal". Such coercion allows for interaction of "wreals" across the libraries and languages, for example.

Figure 8:
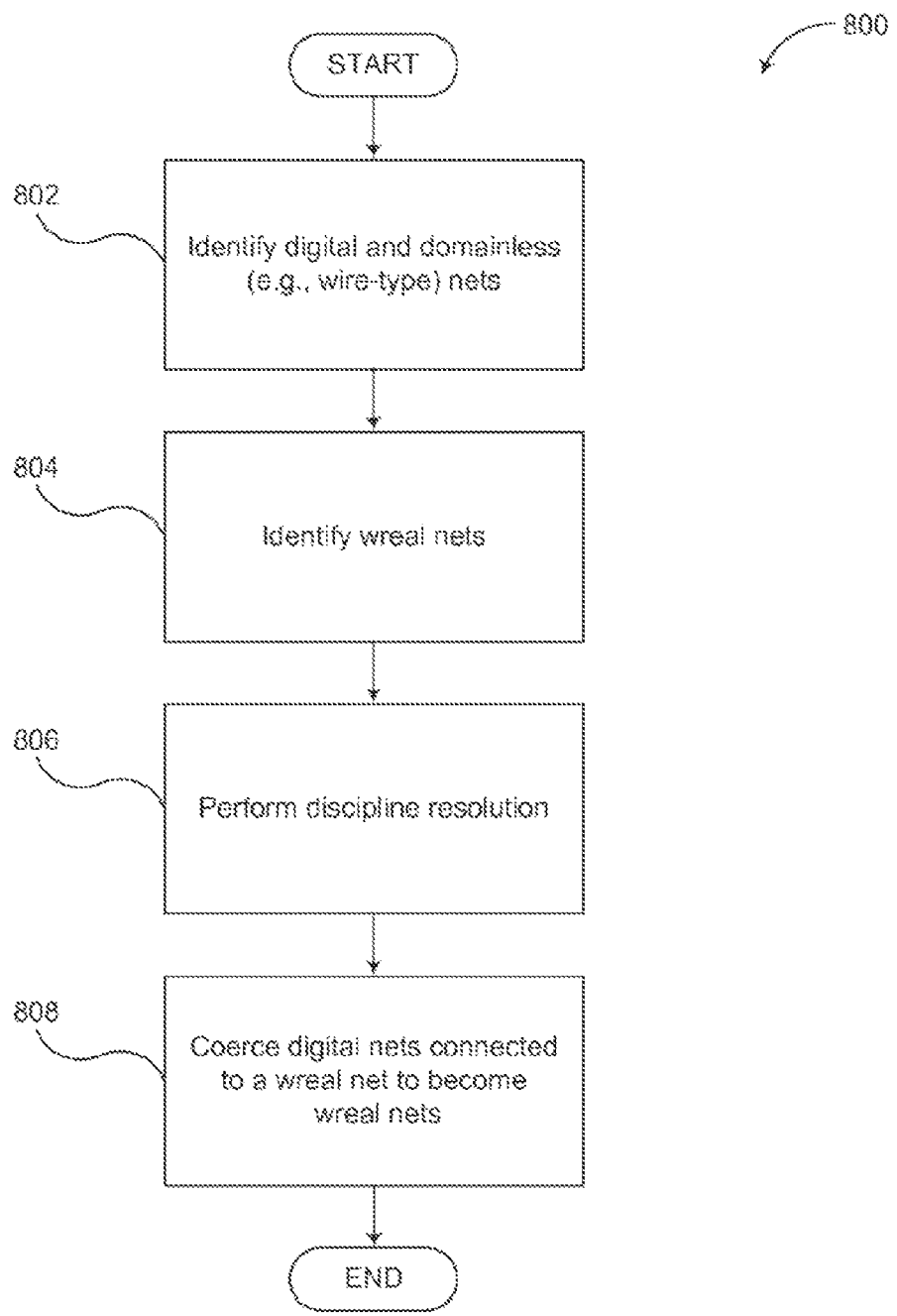
FIG. 8 is an illustrative flow diagram of a wreal coercion process in accordance with some embodiments of the invention.

FIG. 8 is an illustrative flow diagram of a wreal coercion process 800 performed during an elaboration phase of a simulation process in accordance with some embodiments of the invention. A computer system is configured to execute computer instructions to implement the coercion process 800. It will be understood that each block in the flow diagram represents a code module in a computer program stored in computer readable storage media to cause a computer system to implement the coercion process 800.

Module 802 identifies all digital nets and all domainless, (e.g., "wire" type), including pass-through nets, as the design is traversed. A domainless net is one that is left to the simulation tool to determine which simulator needs to evaluate it based on its usage and connectivity. A pass-through is a net that is used for connecting a signal from one hierarchical scope to another. A pass-though net can be a domainless net prior to elaboration. Module 804 identifies all wreal nets in the design as the design is traversed. Module 806 performs Verilog-AMS discipline resolution algorithm to determine the domain of net segment in a design.

At the end of discipline resolution all of the domainless nets get a domain assigned. In other words, user can know which nets will be computed by which simulator. The result of discipline resolution is a domain-aware design, i.e. every net segment belongs to either digital or analog. However, it will be understood by persons skilled in the art that it is possible that at the end of a discipline resolution process, there may be nets that have an assigned domain but lack an associated discipline. For example, a digital net may have a domain assigned based upon usage (e.g., assignment of a signal having a binary bit value to a net) rather than based upon an assigned discipline. The domain of an electrical (analog) net, however, is determined based upon an assigned discipline.

At this point, the design is ready for wreal coercion. Module 808, for every hierarchical digital island (i.e. a connection of digital net segments) if a given net is a digital domain net and connected to a wreal net, then, the given net is coerced to a wreal net. The process 800 is repeated until all applicable nets in the design are processed i.e. until no further coercion is possible. The implementation of this coercion process can either combine or execute the first three steps in any order as long as the semantics of the above process are preserved.

Example: Coercion of Verilog Wires to Wreals

Figures 9A, 9B:
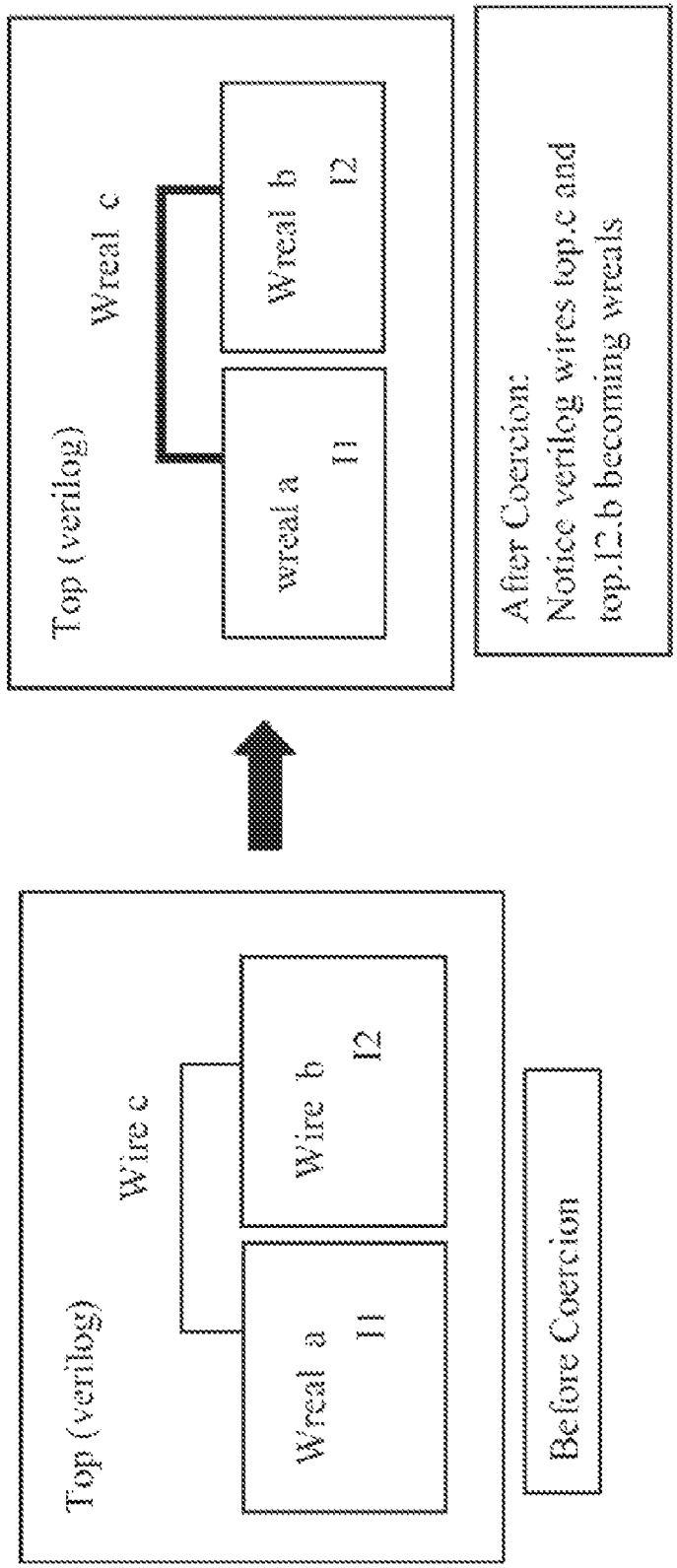
FIGS. 9A-9B are illustrative block diagrams of a first design before (FIG. 9A) and after (FIG. 9B) wreal coercion in accordance with some embodiments of the invention.

FIGS. 9A-9B are illustrative block diagrams of a first circuit design before (FIG. 9A) and after (FIG. 9B) wreal coercion in accordance with some embodiments of the invention. Top comprises a Verilog-AMS design that includes an instance I1 of a first Verilog AMS module and that includes an instance I2 of a second Verilog AMS module. I1 includes a port "a", and I2 includes a port "b". FIG. 9A shows the model before coercion in which port "a" is of the wreal type and port "b" is of the wire type, and in which port "a" and port "b" are connected by a wire type net "c". FIG. 9B shows the model following wreal coercion in accordance with some embodiments of the invention, in which port "b" has been coerced to the wreal type and net c has been coerced to the wreal type.

It will be appreciated that wreal coercion in accordance with some embodiments, therefore, provides the ability to coerce a wire type net to wreal type based not only its immediate connection to a wreal type but also including any indirect wreal digital net connection within that digital segment hierarchy. Referring to FIG. 9B, port "b" of instance I2 became wreal based on its indirect connectivity to wreal 'a' through the digital net segment of wire 'c'.

In the past, this Verilog-AMS LRM restriction generally required a user to modify the design whenever any particular block in the design was reconfigured in such a way that it would violate the above Verilog-AMS LRM semantics. This could be time-consuming task. In many cases, the design may be 'read-only' (i.e., no changes allowed) and available for simulation only. In a crux, designers want the flexibility to reconfigure their designs to various levels of abstraction (e.g., digital, analog, or mixed-signal) to fit their design and verification needs. A wreal coercion process in accordance with some embodiments of the invention enables this flexibility for the design/verification engineer.

Thus, wreal coercion is achieved without requiring the designer to modify the original design to meet Verilog-AMS semantics for simulation purposes. When the wire 'c', is modified to 'wreal c', the semantics of the net 'c' has changed from 'wire' semantics to 'wreal' semantics for the purpose of simulation. i.e. all wreal semantics (like those discussed in other sections of this document) are now applicable to the coerced wire 'c' also—without any additional effort from the user.

Example: Coercion of Verilog Wires to Wreals in a Hierarchical Design

FIGS. 10A-10B are illustrative block diagrams of a hierarchical second circuit model before (FIG. 10A) and after (FIG. 10B) wreal coercion in accordance with some embodiments of the invention. FIGS. 10A-10B show a hierarchical Verilog-AMS model that includes blocks D1-D4. Block D4 is the lowest level block in the design hierarchy. Block D3 is the next level higher block in the design hierarchy above D4. Block D2 is the next level higher block in the design hierarchy above D3. Block D1 is the next level higher block in the design hierarchy above D2. FIG. 10A, which represents the design before coercion, shows a wire type net in D1 connected to a wreal type net in D2. FIG. 10B, which represents the design after coercion, shows wreal type net D1 connected to a wreal type net in D2. Note that there is no change in the wire type net of D4, which is connected to electrical type net in D3, since the wire type net in D4 is not directly connected to a wreal type net.

It will be appreciated that one difference between FIGS. 9A-9B and FIGS. 10A-10B is the presence of an electrical net segment in the hierarchical signal shown in FIGS. 10A-10B. If that net segment instead was a 'wire' net segment, then, all of the net segments—D1, D3 and D4 would have been coerced to wreal type. This would have been like the same in FIGS. 9A-4B. However, in FIGS. 10A-10B, since D3 is an electrical net, the wreal coercion was limited to the net segment D1 only, i.e. coercion applies only to that net segment which is directly connected to a wreal net (either declared or coerced).

Example: Coercion of Verilog-Wires to Wreals Due to Connections to VHDL-D Reals

Figures 11A, 11B:
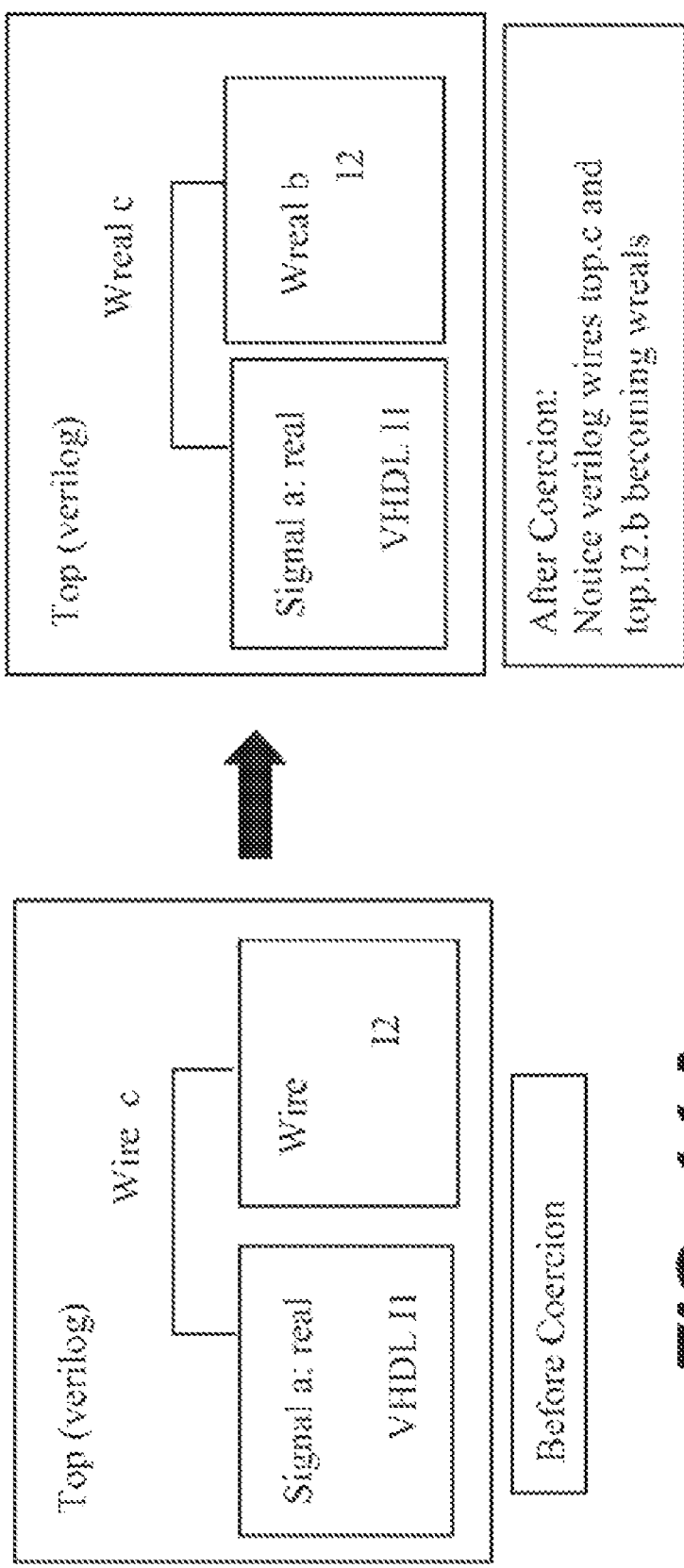
FIGS. 11A-11B are illustrative block diagrams of a third circuit design before (FIG. 11A) and after (FIG. 11B) wreal coercion in accordance with some embodiments.

FIGS. 11A-11B are illustrative block diagrams of a third circuit design before (FIG. 11A) and after (FIG. 11B) wreal coercion in accordance with some embodiments. Top comprises a Verilog-AMS design that includes an instance I1 of a VHDL-D module and that includes an instance I1 of a Verilog AMS module. I1 includes a port "a", and 12 includes a port "b". FIG. 11A shows the model before coercion in which port "a" is of the real signal type and port "b" is of the wire type, and in which port "a" and port "b" are connected by a wire type net "c". FIG. 11B shows the design following wreal coercion in accordance with some embodiments of the invention, in which net "c" in the block Top and net "b" in instance I2 are coerced to the wreal type.

It will be appreciated that although FIGS. 11A-11B are shown with I1 representing a VHDL-D module, coercion in accordance with some embodiments also works for System-Verilog Reals. Thus, for example, if I1 in FIGS. 11A-11B is replaced by a System-Verilog module and port "a" was a System-Verilog real, then the same coercion result shown in FIG. 11B with wire net "c" in the block Top and net "b" in instance I2 coerced to the wreal net type.

It will be appreciated that in accordance with some embodiments of the invention, the presence of a real net type in a digital language such as VHDL influences the coercion of the wire type Verilog net to a Verilog-AMS wreal type. Note that the wreal coercion process applies only to the pass-through net segments in Verilog (and its derivatives like VerilogAMS, SystemVerilog). The wreal coercion process itself can be triggered by the presence of a wreal Verilog-AMS type or a real type in any other digital language—for example, the VHDL real type or the SystemVerilog real type.

Example: Coercion in Presence of Electrical Signals

Figures 12A, 12B:
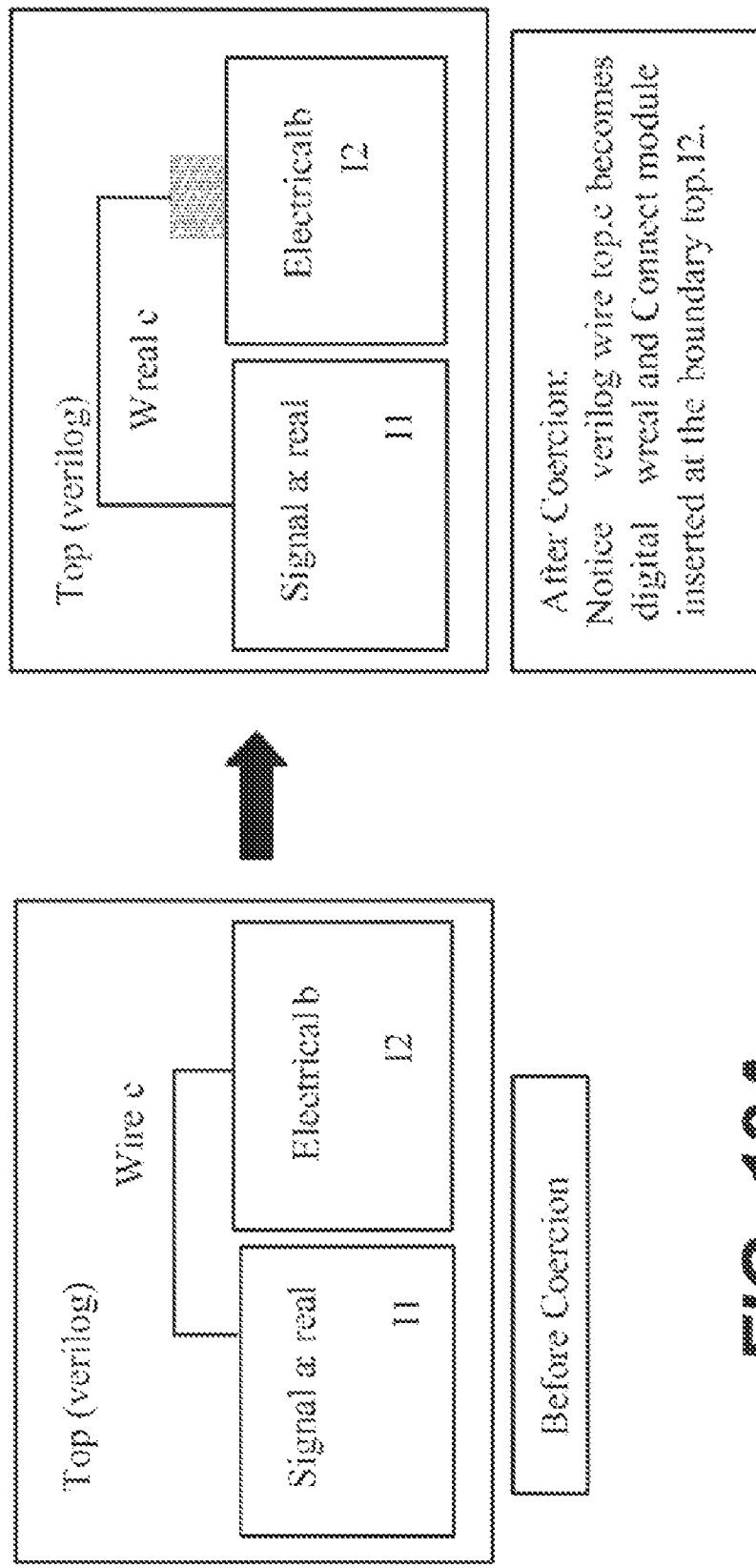
FIGS. 12A-12B are illustrative block diagrams of a fourth circuit design before (FIG. 12A) and after (FIG. 12B) wreal coercion in accordance with some embodiments of the invention.

FIGS. 12A-12B are illustrative block diagrams representing a fourth circuit design before (FIG. 12A) and after (FIG. 12B) wreal coercion in accordance with some embodiments of the invention. Top comprises a Verilog-AMS design that includes an instance I1 of a VHDL-D module and that includes an instance I2 of a Verilog AMS module. I1 includes a port "a", and I2 includes a port "b". FIG. 12A shows the model before coercion in which port "a" is of the real signal type and port "b" is of the electrical type, and in which port "a" and port "b" are connected by a wire type net "c". FIG. 12B shows the model following wreal coercion in accordance with some embodiments, in which net "c" has been coerced to the wreal type and a connect module is inserted at a boundary of the wreal type net "c" and port "b".

Thus, the wreal coercion allows users to bring in their existing libraries/design blocks etc. to interact with wreal models without needing any changes/updates. This can be a benefit in extending the support of wreals to circuit designs that contain read-only (e.g. third party IP) blocks, for example.

Again, it will be appreciated that the presence of real type in a non-Verilog digital language like VHDL influences the coercion of the Verilog wire type to wreal although that Verilog net is connected to a Verilog-AMS analog (electrical) net. This demonstrates the wreal coercion technology on nets connected to any digital language besides Verilog and in the presence of Verilog-AMS analog nets. Note that the previous section did not have analog net connection.

Wreal Coercion and Multiple Wreal Driver Resolution

Figure 13:
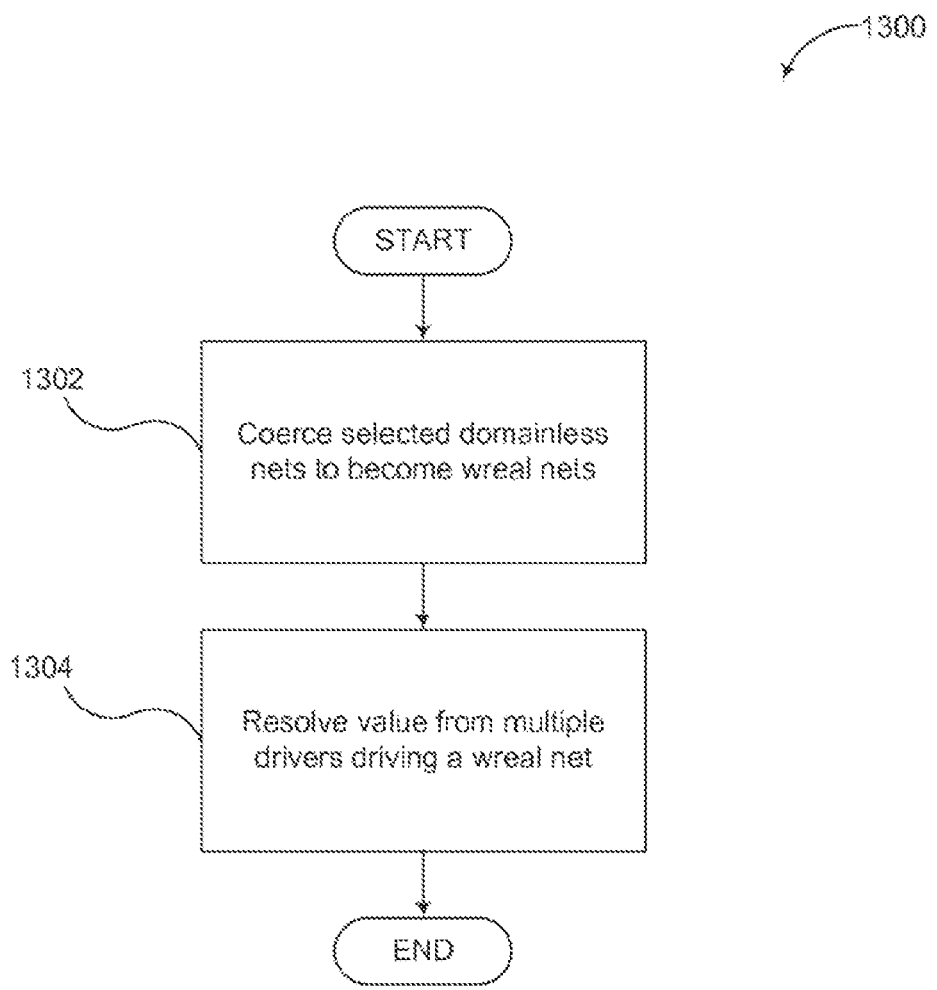
FIG. 13 is an illustrative flow diagram of a computer implemented process to coerce a net to a wreal net in an integrated circuit design and to resolve multiple drivers that drive a wreal net in the design in accordance with some embodiments of the invention.

FIG. 13 is an illustrative flow diagram of a computer implemented process 1300 to coerce a net to a wreal net in an integrated circuit design and to resolve multiple drivers that drive a wreal net in the design in accordance with some embodiments of the invention. A computer system is configured to execute computer instructions to implement the process 1300. It will be understood that each module in the flow diagram represents a code module in a computer program stored in computer readable storage media to cause a computer system to implement the second driver resolution process 1300.

The overall process of FIG. 13 encompasses both coercion and multiple wreal driver resolution so as to integrate RVMs across a design simulation. Coercion, for example, converts digital wire nets to become wreal nets so as to integrate design non-Verilog-AMS design blocks with Verilog-AMS design blocks. Module 1302 represents a process to cause a computer system to coerce (i.e. convert) a digital net such as a wire type net to a wreal type net. Module 1304 represents a process to cause a computer system to resolve multiple drivers driving a wreal net. The coercion process of module 1302 occurs during an elaboration phase of circuit simulation. A multiple driver resolution selection process of module 1304 selects a multiple driver resolution function during the elaboration phase, and the selected driver resolution process is employed to resolve values in the course of simulation. Persons skilled in the art will appreciate that coercion may occur across different scopes of a design hierarchy, and also will appreciate that a multiple wreal driver resolution may occur across different scopes in a design hierarchy.

Computer System to Run Simulation

Figure 14:
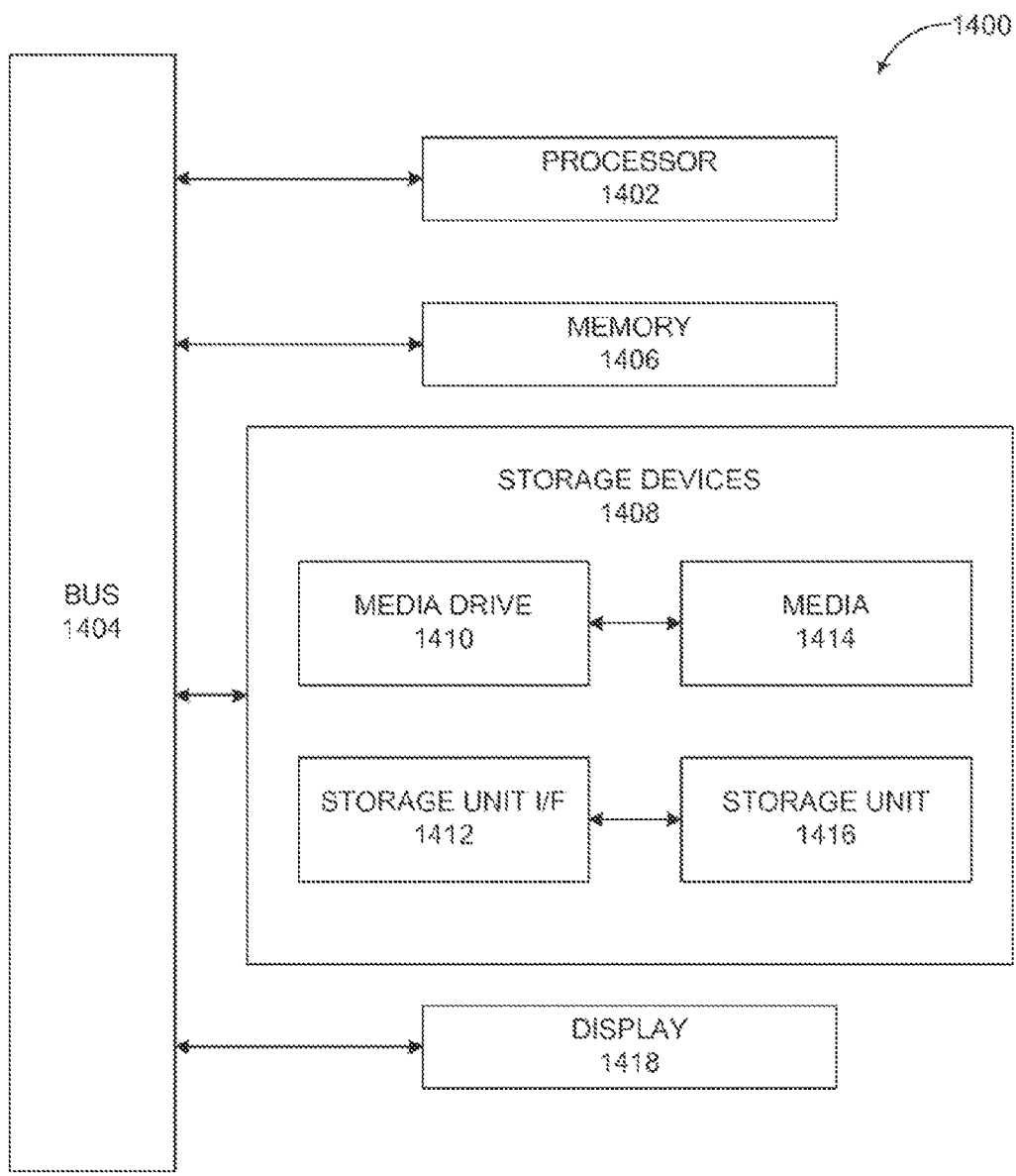
FIG. 14 is an illustrative block level diagram of a computer system that can be programmed to perform wreal driver resolution and wreal coercion in accordance with some embodiments of the invention.

FIG. 14 is an illustrative block level diagram of a computer system 1400 that can be configured to perform wreal driver resolution and wreal coercion in accordance with some embodiments of the invention. Computer system 1400 can include one or more processors, such as a processor 1402. Processor 1402 can be implemented using a general or special purpose processing engine such as, for example, a microprocessor, controller or other control logic. In the example illustrated in FIG. 13 processor 1402 is connected to a bus 1404 or other communication medium.

Computing system 1400 also can include a main memory 1406, preferably random access memory (RAM) or other dynamic memory, for storing information and instructions, such as the code of Tables 1-2 and 6-11, for example. Main memory 1406 also may be used for storing the programs for storing instructions to configure the processor 1402 to implement the wreal driver resolution process and to implement the wreal coercion process. Moreover, the memory 1406 can store code to configure the processor 1402 to use a discipline information to implement a driver resolution process. Computer system 1400 can likewise include a read only memory ("ROM") or other static storage device coupled to bus 1404 for storing static information and instructions for processor system 1402. Moreover, the main memory 1406 and the persistent storage devices 1408 may store data such as simulation waveforms or design database or a computer program such as an integrated circuit design simulation process, for example.

The persistent storage devices 1408 may include, for example, a media drive 1410 and a storage interface 1412. The media drive 8510 can include a drive or other mechanism to support storage media 1414. For example, a hard disk drive, a floppy disk drive, a magnetic tape drive, an optical disk drive, a CD or DVD drive (R or RW), or other removable or fixed media drive. Storage media 1414, can include, for example, a hard disk, a floppy disk, magnetic tape, optical disk, a CD or DVD, or other fixed or removable medium that is read by and written to by media drive 1410. Information storage mechanism 1408 also may include a storage unit 1416 in communication with interface 1412.

The computer system 1400 also includes a user interface (UI) display unit 1418 that can be used to display user input information such as command line information, for example.

In this document, the terms "computer readable storage medium" is used to generally refer to storage media such as, for example, memory 1406, storage devices 1408, a hard disk installed in hard disk drive 1410. These and other various forms of computer useable storage media may be involved in carrying one or more sequences of one or more instructions to processor 1402 for execution. Such instructions, generally referred to as "computer program code" (which may be grouped in the form of computer programs or other groupings), when executed, enable the computing system 1400 to perform features or functions of the present invention as discussed herein.

The foregoing description and drawings of preferred embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:

1. A method to resolve a real number value from multiple values driven by multiple drivers onto a wreal net of an integrated circuit design in the course of running of a simulation of the design on a computer system, comprising:
providing in computer readable storage medium computer readable instructions to enable a computer system to execute multiple different driver resolution processes;
running a driver resolution selection process on a computer system to select a driver resolution process from among the multiple different driver resolution processes to apply to a given wreal net in the integrated circuit design that that is coupled to receive values from multiple drivers;
running the selected driver resolution process on the computer system to resolve values driven to the given wreal net by the multiple drivers in the course of the simulation of the design.

2. The method of claim 1 further including:
associating in the computer readable storage medium one or more of the multiple driver resolution processes with one or more respective disciplines;
wherein the driver resolution selection process selects the driver resolution process to apply to the given wreal net based at least upon a discipline associated with the given wreal net.

3. The method of claim 2,
wherein the associating the multiple driver resolution processes with one or more respective disciplines includes providing such associating within an external configuration data structure within the computer readable storage medium that cause a computer system running the simulation process to effect such associating.

4. The method of claim 2,
wherein the associating the multiple driver resolution processes with one or more respective disciplines includes associating within a discipline declaration within a design block internal to an integrated circuit design.

5. The method of claim 2,
wherein the driver resolution selection process selects the driver resolution process to apply to the given net based at least upon a driver resolution process that is associated with a discipline that is associated with a different wreal net that is connected in the design to the given net.

6. The method of claim 1 further including:
associating in the computer readable storage medium one or more of the multiple driver resolution processes with one or more respective disciplines;
wherein the driver resolution selection process selects based at least upon one of,
a discipline associated in the computer readable medium with the given wreal net; and
a driver resolution process that is associated with a different wreal net that is connected in the design to the given net.

7. The method of claim 1 further including;
associating in the computer readable storage medium one or more of the multiple driver resolution processes with one or more respective disciplines;
wherein the driver resolution selection process selects based upon a prioritization among at least,
a discipline associated in the computer readable medium with the given wreal net; and
a driver resolution process that is associated with a different wreal net that is connected in the design to the given net.

8. The method of claim 1 further including:
associating in the computer readable storage medium one or more of the multiple driver resolution processes with one or more respective disciplines;
wherein the driver resolution selection process based at least upon one of,
a discipline associated in a configuration data structure in the computer readable medium with the given wreal net;
a discipline associated in a discipline declaration in the computer readable medium with the given wreal net; and
a driver resolution process that is associated with a different wreal net that is connected in the design to the given net.

9. The method of claim 1 further including:
associating in the computer readable storage medium one or more of the multiple driver resolution processes with one or more respective disciplines;
wherein the driver resolution selection process based upon a prioritization among at least the following set forth in descending precedence,
a discipline associated in a configuration data structure in the computer readable medium with the given wreal net;
a discipline associated in a discipline declaration in the computer readable medium with the given wreal net; and
a driver resolution process that is associated with a different wreal net that is connected in the design to the given net.

10. The method of claim 1,
wherein at least one of the driver resolution processes resolves values driven by multiple drivers in accordance with current semantics; and
wherein at least one of the driver resolution processes resolves values driven by multiple drivers in accordance with voltage semantics.

11. A method to resolve a real number value from multiple values driven h multiple drivers onto a wreal net of an integrated circuit design in the course of running of a simulation of the design on a computer system, comprising:
running a driver resolution process on a computer system including the acts of
driving a no operation onto the wreal net when all of the multiple drivers drive a no operation state onto the wreal not
driving a value onto the wreal net that is driven by one or more given drivers when only that one given value is driven onto the wreal net by such one or more given drivers and no other driver drives an unknown value onto the wreal net;
driving an unknown value onto the wreal net when two or more given drivers drive different values onto the wreal net; and
driving an unknown value onto the wreal net when at least one given driver drives an unknown value onto the wreal net.

12. A method to resolve a real number value from multiple values driven by multiple drivers onto a wreal net of an integrated circuit design in the course of running of a simulation of the design on a computer system, comprising:
running a driver resolution process on a computer system including the acts of, driving an unknown value onto the wreal net when at least one driver drives an unknown state onto the wreal net;
driving a no operation value onto the \weal net when all of the multiple drivers drive a no operation state onto the wreal net; and
driving a sum of non-no operation values driven onto the wreal net when one or more drivers drive non-no operation values onto the wreal net and no drivers drive unknown values onto the wreal net.

13. A method to resolve a real number value from multiple values driven by multiple drivers onto a wreal net of an integrated circuit design in the course of running of a simulation of the design on a computer system comprising:
  running a driver resolution process on a computer system including the acts of, driving an unknown value onto the wreal net when at least one driver drives an unknown state onto the wreal net;
  driving a pass-through value onto the wreal net when all of the multiple rivers drive a pass-through state onto the wreal net; and
  driving an average of non-pass-through values driven onto the wreal net when one or more drivers drive non-pass-through values onto the wreal net and no drivers drive unknown values onto the wreal net.

14. An article of manufacture including a computer readable storage medium encoded with computer executable code to cause a computer system to perform a process to resolve a real number value from multiple values driven by multiple drivers onto a wreal net of an integrated circuit design in the course of running of a simulation of the design, the process comprising:
  providing in the computer readable storage medium computer readable instructions to enable the computer system to execute multiple different driver resolution processes;
  running a driver resolution selection process on a computer system to select a driver resolution process from among the multiple different driver resolution processes to apply to a given wreal net in the integrated circuit design that that is coupled to receive values from multiple drivers;
  running the selected driver resolution process on the computer system to resolve values driven to the given wreal net by the multiple drivers in the course of the simulation of the design.

15. A method to coerce a wire type net in an integrated circuit design to become a wreal net in the design comprising:
  running a wreal coercion process on a computer system including the acts of identifying a wire type net that is connected to a wreal net in an integrated circuit design; and
  converting the identified wire type net to a wreal net.

16. The method of claim 15,
  wherein the wreal net comprises a wreal port of a Veritog-AMS design block.

17. The method of claim 15,
  wherein the identified wire type net comprises a pass-through net that connects hierarchical design blocks in different levels of a hierarchical design.

18. The method of claim 15,
  wherein the identified wire type net comprises a pass-through net that connects a first design block in a first scope of a hierarchical design with a second design block in a second scope of the hierarchical design.

19. The method of claim 15,
  wherein the identified digital net includes a VerilogAMS wire type net.

20. The method of claim 15,
  wherein the identified wire type net connects a design block having a wreal output port with a design block having a wire type output port; and further including:
  converting the wire type output port to a wreal output port.

21. The method of claim 15,
  wherein the identified wire type net connects a Verilog-AMS design block and a non-Verilog-AMS design block.

22. The method of claim 15,
  wherein the identified wire type net connects a Verilog-AMS design block and a VHDL design block.

23. The method of claim 15,
  wherein the identified wire type net connects a Verilog-AMS design block and a System-Yen log design block.

24. The method of claim 15,
  wherein the identified wire type net connects a digital design block and an electrical design block; and further including:
  inserting a connect module between the wreal net and the electrical design block.

25. The method of claim 15 further including:
  running a simulation process on a computer system including the act of, driving a real value onto the converted wreal net.

26. An article of manufacture including a computer readable storage medium encoded with computer executable code to cause a computer system to perform a process to coerce a wire type net in an integrated circuit design to become a wreal net in the design in the course of running of a simulation of the design, the process comprising:
  running a wreal coercion process on a computer system including the acts of
  identifying a wire type net that is connected to a wreal net in an integrated circuit design; and
  converting the identified wire type net to a wreal net.

27. An integrated circuit simulation method comprising:
  running a wreal coercion process on a computer system including the acts of,
  identifying a wire type net that is connected to a wreal net in an integrated circuit design;
  converting the identified wire type net to a wreal net;
  providing in computer readable storage medium computer readable instructions to enable a computer system to execute multiple different driver resolution processes;
  running a driver resolution selection process on a computer system to select a driver resolution process from among the multiple different driver resolution processes to apply to a given wreal net in the integrated circuit design that that is coupled to receive values from multiple drivers;
  running the selected driver resolution process on the computer system to resolve values driven to the given wreal net by the multiple drivers in the course of the simulation of the design.

28. The method of claim 27,
  wherein the given wreal net includes the converted wreal net.

* * * * *